(12) United States Patent
Wang et al.

(10) Patent No.: US 11,824,245 B2
(45) Date of Patent: Nov. 21, 2023

(54) PHASE SHIFTER-180 DEGREE TOPOLOGY

(71) Applicant: Analog Devices, Inc., Wilmington, MA (US)

(72) Inventors: Xudong Wang, Colorado Springs, CO (US); Jinzhou Cao, Hillsboro, OR (US); Song Lin, Lexington, MA (US)

(73) Assignee: Analog Devices, Inc., Wilmington, MA (US)

( * ) Notice: Subject to any disclaimer, the term of this patent is extended or adjusted under 35 U.S.C. 154(b) by 7 days.

(21) Appl. No.: 17/551,367

(22) Filed: Dec. 15, 2021

(65) Prior Publication Data
US 2022/0231391 A1    Jul. 21, 2022

Related U.S. Application Data

(60) Provisional application No. 63/138,054, filed on Jan. 15, 2021.

(51) Int. Cl.
*H01P 1/18* (2006.01)
*H03H 11/20* (2006.01)

(52) U.S. Cl.
CPC ............ *H01P 1/18* (2013.01); *H03H 11/20* (2013.01)

(58) Field of Classification Search
CPC .................................. H01P 1/18; H03H 11/20
See application file for complete search history.

(56) References Cited

U.S. PATENT DOCUMENTS

| | | | |
|---|---|---|---|
| 3,184,681 A | * 5/1965 | Bloniarz | H03H 11/18 324/76.78 |
| 10,211,812 B2 | 2/2019 | Shimura | |
| 10,523,167 B2 | 12/2019 | Shimura | |
| 10,734,972 B1 | 8/2020 | Lin et al. | |
| 2019/0036728 A1* | 1/2019 | Hu | H02P 6/00 |

FOREIGN PATENT DOCUMENTS

| | | | |
|---|---|---|---|
| CN | 216794962 U | 6/2022 | |
| DE | 202022100019 U1 | 4/2022 | |
| JP | H0864437 A | * 3/1996 | H01F 29/02 |

OTHER PUBLICATIONS

Wang et al., *Poster: A 60 GHz Phased Array System Evaluation Based on a 5-bit Phase Shifter in CMOS Technology*, 978-1-5090-4361-3/16 © 2016 IEEE, 4 pages.
(Continued)

*Primary Examiner* — Daniel C Puentes
(74) *Attorney, Agent, or Firm* — Schwegman Lundberg & Woessner, P.A.

(57) ABSTRACT

Systems, devices, and methods related to phase shifters are provided. An example apparatus includes a first node to receive an input signal, a second node, a first signal path coupled between the first node and the second node, and a second signal path coupled between the first node and the second node. The first signal path includes a positively coupled transformer. The second signal path includes a negatively coupled transformer. The second signal path is out-of-phase with the first signal path at the second node. The apparatus further includes a plurality of switches to select the first signal path or the second signal path. The apparatus may further include tuning capacitors to improve phase-shifting performance of the apparatus.

20 Claims, 12 Drawing Sheets

(56) References Cited

OTHER PUBLICATIONS

Sharma et al., *A Ku-Band 6-bit Digital Phase Shifter MMIC for Phased Array Antenna Systems*, 2015 IEEE International Microwave and RF Conference (IMaRC), 4 pages.
Wei et al., *Analysis and Design of a 35-GHz Hybrid π-Network High-Gain Phase Shifter with 360° Continuous Phase Shifting*, IEEE Jan. 22, 2021, 11 pages.

\* cited by examiner

PHASE SHIFTER-180 DEGREE TOPOLOGY

CROSS REFERENCE TO RELATED APPLICATIONS

The present application claims priority to and the benefit of the U.S. Provisional Patent Application No. 63/138,054 entitled "PHASE SHIFTER-180 DEGREE TOPOLOGY" and filed Jan. 15, 2021, which is hereby incorporated by reference in its entirety as if fully set forth below and for all applicable purposes.

TECHNICAL FIELD OF THE DISCLOSURE

The present disclosure generally relates to integrated circuits, and, more specifically, to phase-shifters (e.g., in phased array systems).

BACKGROUND

Phase shifters and true-time-delay (TTD) components are commonly used in high-frequency systems, in particular, in millimeter wave bands, for signal adjustments. Although a delay in phase or a delay in timing of a signal are substantially the same, phase shifters and TDD delay lines are designed with different goals. For example, phases-shifters may provide signal adjustments in frequency over a designed frequency range, while TDD delay lines may provide signal adjustments in time over a designed frequency range. In some examples, phase shifters may be more suitable for adjusting signals with a narrower bandwidth, while TTD delay lines may be more suitable for adjusting signals with a broader bandwidth.

Some example systems and/or devices that utilize phase shifters may include wireless communication systems, such as Long Term Evolution (LTE) and $5^{th}$ generation (5G), which transmit and receive signals in the form of electromagnetic waves in the radio frequency (RF) range of approximately 3 kiloHertz (kHz) to 300 gigaHertz (GHz). For example, a wireless communication system may utilize a phased array antenna system (which may also be referred to as an electrically steerable array (ESA)) for wireless transmission and reception. A phased array antenna system may include an array of antenna elements (e.g., about 64, 128, 256, 1024 or more). The individual antenna element may transmit signals of the same frequency but with a certain phase shift between each antenna element in the array. The phase-shifts may be calculated to provide constructive interference in the desired spatial direction while destructive interference may occur in other directions. In this way, the combined transmitted signals from the antenna elements may provide a better gain, directivity, and performance in the desired spatial direction. Stated differently, the phases of the antenna elements are controlled to force the electromagnetic wave to add up at a particular angle to the array. To that end, the phase antenna array system may utilize phase shifters to phase-shift signals to be transmitted by the antenna elements. The process of adjusting phases of signals to be transmitted by the antenna elements in the array may be referred to as beamforming. The phase-shifts may vary anywhere between 0 degrees to 360 degrees. A phase-shift of 180 degrees (where a phase shifter provides two output phase states with a phase difference of 180 degrees) may be the most challenging to design among the various phase-shifts, for example, in terms of insertion loss, operable bandwidth, and/or phase flatness across the operable bandwidth. Accordingly, technique improvements for providing 180 degree phase shifters may be desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
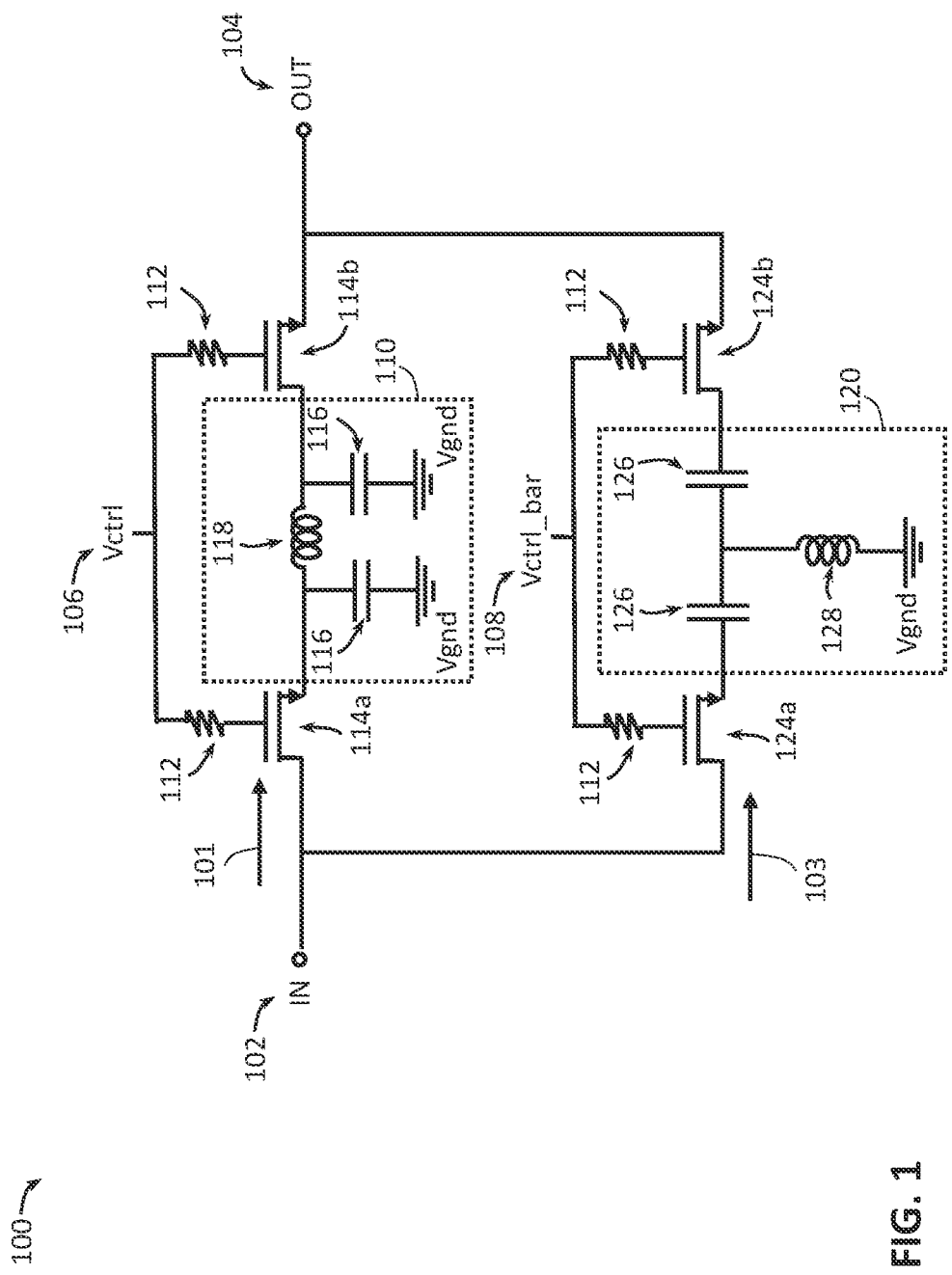
FIG. 1 is a schematic diagram illustrating an exemplary switched filter-based phase shifter circuitry.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

A phase shifter is a two-port network that receives an input signal and outputs a phase-shifted version of the input signal. As discussed above, phase shifters may be utilized in various systems such as phased array antenna systems and/or beamforming integrated circuit devices. The performance of a phase shifter may be characterized by its insertion loss (or gain) and/or amplitudes in all phase states, flatness of its phase response across frequency, reciprocal network performance, operating bandwidth, power handling capability, and/or size (e.g., silicon die area). In general, it may be desirable for a phase shifter to have a lower insertion loss, operate over a wider bandwidth with a flat phase-shift (a constant phase) over the wide bandwidth, and have a smaller die size.

As discussed above, a 180 degree phase shifter may be the most challenging to design among phase shifters of various phase-shifts. A 180 degree phase shifter is a two-port network providing two output phase states with a difference of 180 degrees. One approach to implementing 180 degree phase shifters is to use a switched filter topology. For instance, a 180 degree phase shifter may switch between high-pass and low-pass filter networks (e.g., with a combination of inductor(s) and capacitor(s)) matched for their insertion loss at the center frequency of operation. One disadvantage of such an approach is that the low-pass and high-pass filter networks are designed around the center operating frequency, thus the operating frequency bandwidth may be limited.

It may be challenging to provide a 180 degree phase shifter with a flat phase (e.g., a constant phase) across a wide bandwidth while maintaining a low insertion loss using the switched filter technique. For instance, when using the switched filter technique, insertion loss is often compromised to provide a flat phase across the bandwidth of interest. As an example, to balance phase flatness for a switched filter-based 180 degree phase shifter to operate in a Ku band (e.g., within a 12 to 18 gigahertz (GHz) range) or a Ka band (e.g., within a 26.5 to 40 GHz range), the insertion loss may be greater than about 1.5 decibels (dB). In a phased array antenna system, a large insertion loss may be undesirable because more power will be consumed to provide the same output power. While additional circuit components (e.g., inductors) can be added to a switched filter topology to improve phase flatness with a smaller compromise for insertion loss, the added components can increase the die size, and thus may not be desirable.

The present disclosure describes mechanisms for providing a 180 degree phase shifter in a manner that can address the insertion loss, phase flatness, and die size issues discussed above. One aspect of the present disclosure provides a 180 degree phase shifter using a topology that switches between two transformer paths, one with positive coupling and the other with negative coupling. For example, a phase shifter circuitry may include two signal paths between a first node and a second node, where a first path may include a positively coupled transformer and a second signal path may include a negatively coupled transformer. For the positively coupled transformer, the voltage across the primary coil and the voltage across the secondary coil are in-phase (providing a 0 degree phase-shift). On the other hand, for the negatively coupled transformer, the voltage across the primary coil and the voltage across the secondary coil are out-of-phase (providing a 180 degree phase-shift). Stated differently, the primary coil of the positively coupled transformer may have a routing structure in the same direction as the routing structure of the secondary coil of the positively coupled transformer while the primary coil of the negatively coupled transformer may have a routing structure in an opposite direction as the routing structure of the secondary coil of the negatively coupled transformer. The phase shifter circuitry may further include a plurality of switches (e.g., implemented using field effect transistors (FETs)) to select the first signal path or the second signal path. The first signal path (with the positive coupling) and the second signal path (with the negatively coupling) may be out-of-phase with each other at the second node. Stated differently, the phase shifter circuitry can provide a first output phase state when the first signal path is selected and provide a second output phase state when the second signal path is selected, where the first output phase state and the second output phase state have a relative phase difference of about 180 degrees.

To provide a selection between the first signal path and the second signal path, a first switch of the plurality of switches may be coupled between the first node and the positively coupled transformer, a second switch of the plurality of switches may be coupled between the first node and the negatively coupled transformer, a third switch of the plurality of switches may be coupled between the positively coupled transformer and the second node, and a fourth switch of the plurality of switches may be coupled between the negatively coupled transformer and the second node. The first and third switches may be responsive to a first control signal, whereas the second and fourth switches may be responsive to a second control signal. The first control signal and the second control signal may have opposite phases so that only one of the first signal path or the second signal path is selected at a given time.

The present disclosure may also provide various performance improvements to the transformer-based phase shifter circuitry. For example, in some aspects, the phase shifter circuitry may further include shunt FETs to provide better isolation between the two signal paths. Additionally or alternatively, the phase shifter circuitry may utilize stacked FETs for the switches to increase power handling capability. Additionally or alternatively, the phase shifter circuitry may include various tuning capacitor(s) to balance parasitic capacitance differences between the positively coupled transformer and the negatively coupled transformer. Balancing the parasitic capacitance differences between the positively coupled transformer and the negatively coupled transformer can improve phase accuracy.

In some aspects, the switched transformer-based 180 degree phase shifter may be integrated as part of a multi-bit phase shifter, as part of a beamforming integrated device, and/or as part of a phase antenna array system.

The systems, schemes, and mechanisms described herein can provide several benefits. For example, positively coupling and negatively coupling paths naturally result in a 180 degree phase difference between the two paths, and thus the switched transformer-based phase shifter circuitry can operate over a wide bandwidth and provide a substantially flat phase response across the wide bandwidth without the same limitation as the switched filter topology. Additionally, because there is no filter response limitation and no need to compromise between phase flatness and insertion loss as in the switched filter designs, the insertion loss in a switched transformer-based 180 degree phase shifter may be mostly contributed by the "on" resistance of the control FETs (e.g., when the switch is turned on), magnetic coupling loss of the transformer, and the metal resistance of the coils (inductors) at the transformer. All these contributors to the insertion loss may be minimal. Further, the size of a transformer (the positively coupled transformer and/or the negatively coupled transformer) may be substantially smaller than inductors and capacitors that are used to form a switched filter topology. As such, a switched transformer-based phase shifter circuitry can provide a low insertion loss while maintaining a flat phase response across a wide bandwidth for all output phase states (e.g., the first output phase state provided by the first path and the second output phase state provided by the second path) and a small die size. Further-more, because process variation in integrated circuits with capacitors may be large while process variation in integrated circuits with transformers (e.g., the coils or inductors in the transformers) may be low, a switched transformer-based phase shifter (that utilizes transformers) may be less susceptible to process variation than a switched filter-based phase shifter (that utilizes capacitors).

The disclosed embodiments may be suitable for use in wireless communication systems and/or sensor systems. In particular, the systems, schemes, and mechanisms described herein can advantageously improve beamforming performance in high-frequency (e.g., millimeter wave) communication and/or sensor systems.

Example Switched Filter-Based Phase Shifter

FIG. 1 is a schematic diagram illustrating an exemplary switched filter-based phase shifter circuitry 100. The phase shifter circuitry 100 may be part of an integrated circuit device. In some instances, the phase shifter circuitry 100 may be part of a multi-bit phase shifter. In some instances, the phase shifter circuitry 100 may be part of a radio frequency (RF) device. The phase shifter circuitry 100 may utilize a switched filter topology to provide two output phase states with a phase difference of about 180 degrees.

As shown, the phase shifter circuitry 100 may include an input node 102, an output node 104, a first signal path 101 arranged between the input node 102 and the output node 104, and a second signal path 103 arranged between the input node 102 and the output node 104. The first signal path 101 may include a low-pass filter network 110, a switch 114a coupled between the low-pass filter network 110 and the input node 102, and another switch 114b coupled between the low-pass filter network 110 and the output node 104. The low-pass filter network 110 may include an inductor 118 arranged between two capacitors 116 in a Π shape configuration, where each capacitor 116 may have one end coupled to the inductor 118 and another end coupled to a ground potential (shown as Vgnd). The low-pass filter network 110 in the first signal path 101 may be configured to provide a phase-shift of about 180 degrees. The switches 114 may be implemented using FETs. As shown, the drain terminal of the FET 114a may be coupled to the input node 102 and the source terminal of the FET 114a may be coupled to the low-pass filter network 110. The drain terminal of the FET 114b may be coupled to the low-pass filter network 110 and the source terminal of the FET 114b may be coupled to the output node 104. The gate terminals of the FETs 114a and 114b may each be coupled to a resistor 112 and controlled by (or responsive to) a first control signal 106 (shown as Vctrl). For instance, a switch 114 may be switched on when the respective gate terminal receives a logic high (e.g., Vctrl is a logic high) and may be switched off when the respective gate terminal receives a logic low (e.g., Vctrl is a logic low).

The second signal path 103 may include a high-pass filter network 120, a switch 124a coupled between the high-pass filter network 120 and the input node 102, and another switch 124b coupled between the high-pass filter network 120 and the output node 104. The high-pass filter network 120 may include two series capacitors 126 and an inductor 128 arranged in a T-shape configuration, where the inductor 128 may have one end coupled to a node between the two capacitors 126 and another end coupled to a ground potential. The high-pass filter network 120 in the second signal path 103 may be configured to provide a phase-shift of about 0 degree. Similarly, the switches 124 may be implemented using FETs. As shown, the drain terminal of the FET 124a may be coupled to the input node 102 and the source terminal of the FET 124a may be coupled to the high-pass filter network 120. The drain terminal of the FET 114b may be coupled to the high-pass filter network 120 and the source terminal of the FET 124b may be coupled to the output node 104. The gate terminals of the FETs 124a and 124b may each be coupled to a resistor 112 and controlled by (or responsive to) a second control signal 108 (shown as Vctrl_bar). The second control signal 108 may be an inverted signal of the first control signal 106 so that a single one of the first signal path 101 or the second signal path 103 may be selected at any given time. In other words, the phase shifter circuitry 100 may be configured to provide, at the output node 104, a first output signal via the first signal path 101 or a second output signal via the second signal path 103, where the first output signal and the second output signal may have a difference phase (e.g., by 180 degrees).

While the phase shifter circuitry 100 can be configured to provide a 180 degree phase-shift, it may be difficult to provide both a low insertion loss and phase flatness across a wide bandwidth. While additional components (e.g., inductors) can be added to the phase shifter circuitry 100 to provide better phase flatness across an operating bandwidth, the addition of more components can increase the die size. Accordingly, the present disclosure provides techniques to implement a 180 degree phase shifter using a switched transformer topology to overcome the insertion loss and phase flatness issues with the switched filter topology.

Example Switched Transformer-Based Phase Shifter

Figure 2A:
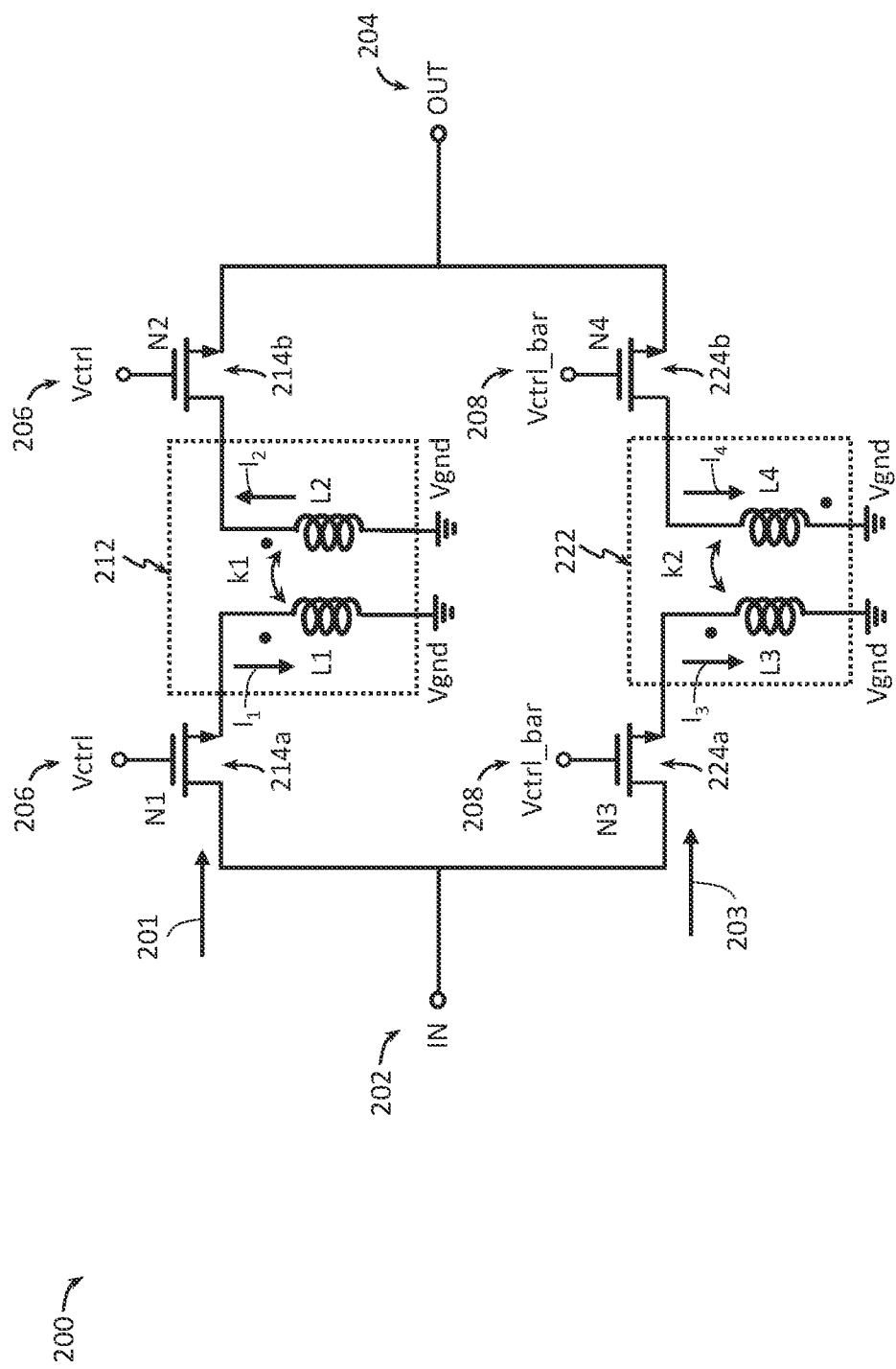
FIG. 2A is a schematic diagram illustrating an exemplary switched transformer-based phase shifter circuitry, according to some embodiments of the present disclosure.

FIG. 2A is a schematic diagram illustrating an exemplary switched transformer-based phase shifter circuitry 200, according to some embodiments of the present disclosure. The phase shifter circuitry 200 may be part of an integrated circuit device. In some instances, the phase shifter circuitry 200 may be part of a multi-bit phase shifter (e.g., the multi-bit phase shifter circuitry 900 of FIG. 9). In some instances, the phase shifter circuitry 200 may be part of an RF device (e.g., the phased array system 1000 of FIG. 10). The phase shifter circuitry 200 may utilize a switched transformer topology to provide two output phase states with a phase difference of about 180 degrees.

As shown, the phase shifter circuitry 200 may include an input node 202, an output node 204, a first signal path 201 arranged between the input node 202 and the output node 204, and a second signal path 203 arranged between the input node 202 and the output node 204. The first signal path 201 may include a positively coupled transformer 212, a switch 214a (shown as N1) coupled between the positively coupled transformer 212 and the input node 202, and another switch 214b (shown as N2) coupled between the positively coupled transformer 212 and the output node 204. The positively coupled transformer 212 may include a primary coil L1 and a secondary coil L2, each connected to a ground potential. The primary coil L1 may be positively coupled to the secondary coil L2 with a coupling factor k1 (e.g., ideally be 1.0, but may be between about 0.7 to about 0.8). The positive coupling is shown by a dot placed at the top of the primary coil L1 and a dot placed at the top of the secondary coil L2. The input signal is connected to the dotted terminal of the primary coil L1 and the output signal is connected to the dotted terminal of the secondary coil L2. More specifically, a current may enter the primary coil L1 from the dotted terminal on the primary coil L1 and may leave the secondary coil L2 from the dotted terminal on the secondary coil L2 as shown by the current $I_1$ and the current $I_2$.

The second signal path 203 may include a negatively coupled transformer 222, a switch 224a (shown as N3) coupled between the negatively coupled transformer 222 and the input node 202, and another switch 214b (shown as N4) coupled between the positively coupled transformer 212 and the output node 204. The negatively coupled transformer 222 may include a primary coil L3 and a secondary coil L4, each connected to a ground potential. The primary coil L3 may be negatively coupled to the secondary coil L4 with a coupling factor k2 (e.g., ideally be 1.0, but may be between about 0.7 to about 0.8). In some instances, the coupling factor k1 for the positively coupled transformer 212 may be about the same as the coupling factor k2 for the negatively coupled transformer 222. The negatively coupling is shown by a dot placed at the top of the primary coil L3 and a dot placed at the bottom of the secondary coil L4. The input signal is connected to the dotted terminal on the primary coil L3 while the output signal is connected to the non-dotted terminal of the secondary coil L4. More specifically, a current may enter the primary coil L3 from the dotted terminal on the primary coil L3 and may leave the secondary coil L4 from the dotted terminal on the secondary coil L4 as shown by the current $I_3$ and the current $I_4$. While FIG. 2A illustrates the current directions for the primary coil L1 and the secondary coil L2 of the positively coupled transformer 212 and the current directions for the primary coil L3 and the secondary coil L4 of the negatively coupled transformer 222, it may not directly translate to the current directions in the layouts or traces of the positively coupled transformer 212 and the negatively coupled transformer 222 as will be discussed more fully below with reference to FIG. 2B.

Based on the configuration with the positively coupled transformer 212 on the first signal path 201 and the negatively coupled transformer 222 on the second signal path 203, the first signal path 201 may be out-of-phase with the second signal path 203 at the output node 204. Accordingly, the phase shifter circuitry 200 may provide two output phase states (a first output phase state from the first signal path 201 and a second output phase state from the second signal path 203) with a relative phase difference of about 180 degrees.

Similar to the phase shifter circuitry 100, the switches 214 and 224 may be implemented as FETs. As shown, the drain terminal of the FET 214a may be coupled to the input node 202 and the source terminal of the FET 214a may be coupled to the positively coupled transformer 212. The drain terminal of the FET 214b may be coupled to the positively coupled transformer 212 and the source terminal of the FET 214b may be coupled to the output node 204. The gate terminals of the FETs 214a and 214b may be controlled by (or responsive to) a first control signal 206 (shown as Vctrl). For instance, a switch 214 may be switched on when the respective gate terminal receives a logic high (e.g., Vctrl is a logic high) and may be turned off when the respective gate terminal receives a logic low (e.g., Vctrl is a logic low). In a similar way, the drain terminal of the FET 224a may be coupled to the input node 202 and the source terminal of the FET 224a may be coupled to the negatively coupled transformer 222. The drain terminal of the FET 224b may be coupled to the negatively coupled transformer 222 and the source terminal of the FET 224b may be coupled to the output node 204. The gate terminals of the FETs 224a and 224b may be controlled by (or responsive to) a second control signal 208 (shown as Vctrl_bar). The second control signal 208 may be an inverted signal of the first control signal 206 so that a single one of the first signal path 201 or the second signal path 203 may be selected at any given time. In other words, the phase shifter circuitry 200 may be configured to conduct an input signal via the first signal path 201 to provide a first output signal at the output node 204, or alternatively, via the second signal path 203 to provide a second output signal at the output node 204, where the first output signal via the first signal path 201 is out-of-phase (phase-shifted by 180 degrees) with the second output signal via the second signal path 203.

As discussed above, because the positive coupling (from the positively coupled transformer 212) used on the first signal path 201 and the negative coupling (from the negatively coupled transformer 222) used on the second signal path 203 can provide a relative phase difference of about 180 degrees between the first signal path 201 and the second signal path 203, there is no filter response limitation and/or manipulation or selection of components to tradeoff insertion loss with phase flatness as in the switched filter topology. Consequently, the switched transformer topology used by phase shifter circuitry 200 can operate over a very broad bandwidth (e.g., an infinite bandwidth) and provide a substantially flat phase across the wide bandwidth (e.g., between the first signal path 201 and the second signal path 203). Further, the phase shifter circuitry 200 can provide low insertion loss (e.g., about 0.5 to 1 decibel (dB) less than switched filter-based phase shifters at a high frequency in Ka and/or Ku bands), which may be mostly contributed by the "on" resistance of the control FETs 214 and 224 (e.g., when the switch is turned on), magnetic coupling loss of the transformer 212 or 222, and the metal resistance of the coils (inductors) at the transformer 212 or 222. Further, because the phase shifter circuitry 200 can provide a relatively flat phase (e.g., with a phase error or phase variation of less than about 0.5 degree in Ka band with a bandwidth of about 3 GHz or in a Ku band with a bandwidth of about 2 GHz, there is no need to add additional inductors into the phase shifter circuitry 200 to improve phase flatness as in the switched filter topology. Consequently, the phase shifter circuitry 200 can provide a compact die size compared to the switched filter topology. Moreover, the positively coupled transformer 212 and the negatively coupled transformer 222 may be less sensitive to process variation than capacitors which are used in a switched filter topology.

Figure 2B:
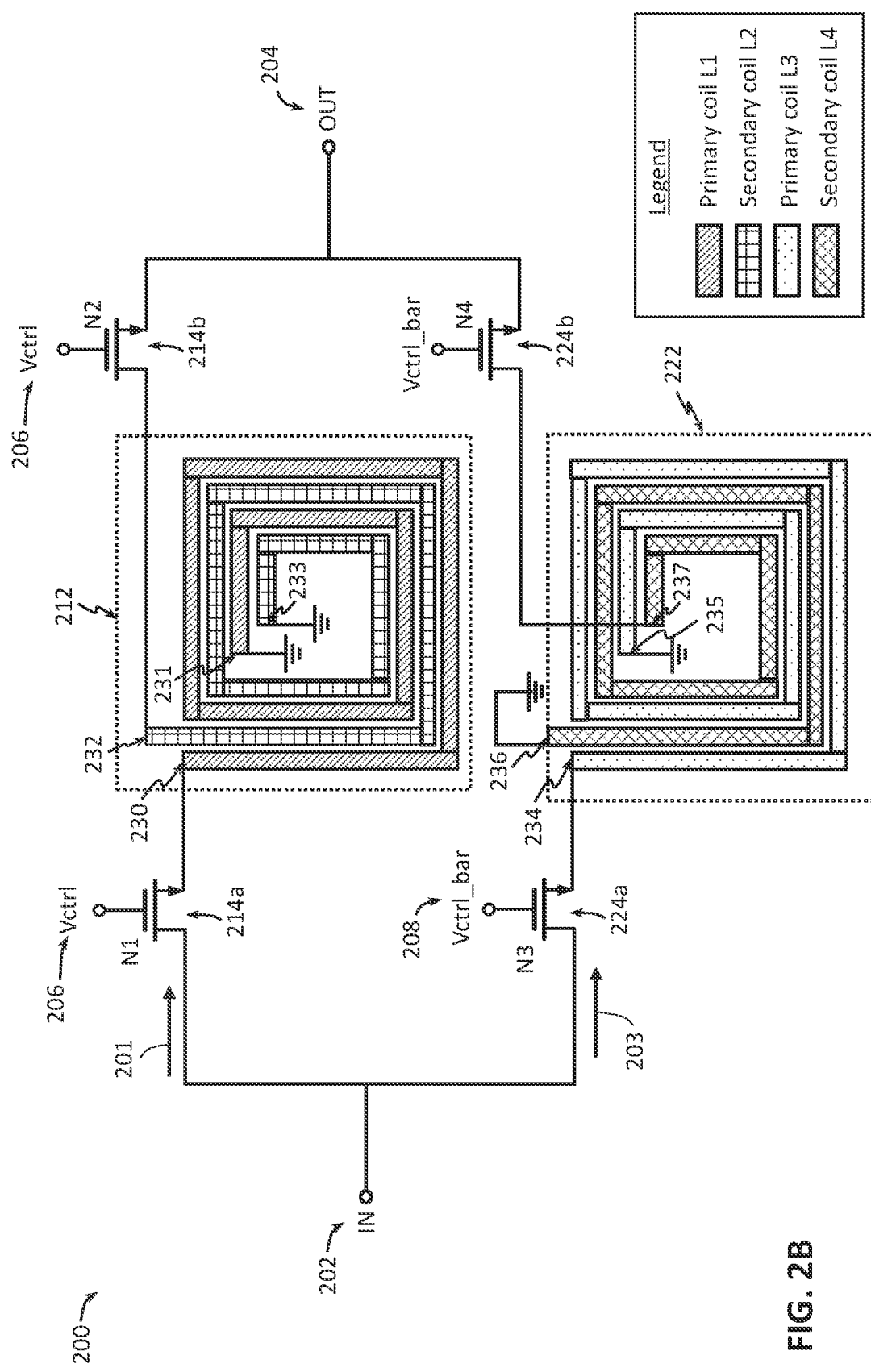
FIG. 2B is a schematic diagram illustrating a more detailed view of the switched transformer-based phase shifter circuitry of FIG. 2A, according to some embodiments of the present disclosure.

FIG. 2B is a schematic diagram illustrating a more detailed view of the transformer-based phase shifter circuitry 200, according to some embodiments of the present disclosure. In particular, FIG. 2B shows the internal routing structure of the positively coupled transformer 212 and the negatively coupled transformer 222. As shown, the primary coil L1 and the secondary coil L2 of the positively coupled transformer 212 are wrapped together, for example, around a magnetic core (not shown). The positive coupling is provided by configuring the routing structure of the primary coil L1 to be in the same direction as the routing structure of the secondary coil L2, for example, by connecting the terminal 230 of the primary coil L1 and the terminal 232 of the secondary coil L2 to signals and connecting the other terminal 231 of the primary coil L1 and the other terminal 233 of the secondary coil L2 to a ground potential. For instance, the terminal 230 and the terminal 232 may correspond to the dotted terminal on the primary coil L1 and the dotted terminal on the secondary coil L2, respectively, shown in FIG. 2A. Thus, the primary current (e.g., $I_1$ shown in FIG. 2A) may enter the terminal 230, and the secondary current (e.g., $I_2$ shown in FIG. 2A) may leave the terminal 232. That is, the primary current may travel in a counter-clockwise direction, and the secondary current may travel in a clockwise direction in the routing structure of the positively coupled transformer 212.

As further shown in FIG. 2B, the primary coil L3 and the secondary coil L4 of the negatively coupled transformer 222 are wrapped together, for example, around a magnetic core (not shown). The negative coupling is provided by configuring the routing structure of the primary coil L3 to be in the opposite direction as the routing structure of the secondary coil L4, for example, by connecting the terminal 234 of the primary coil L3 to signal and the other terminal 235 of the primary coil L4 to a ground potential while connecting the terminal 236 of the secondary coil L4 to a ground potential and the other terminal 237 of the secondary coil L4 to a signal. For instance, the terminal 234 and the terminal 236 may correspond to the dotted terminal on the primary coil L3 and the dotted terminal on the secondary coil L4, respectively, shown in FIG. 2A. Thus, the primary current (e.g., $I_3$ shown in FIG. 2A) may enter the terminal 234, and the secondary current (e.g., $I_4$ shown in FIG. 2A) may leave the terminal 236. That is, the primary current may travel in a counterclockwise direction, and the secondary current may travel in a clockwise direction in the routing structure of the negatively coupled transformer 222.

While FIG. 2B illustrates the positively coupled transformer 212 and the negatively coupled transformer 222 to be about the same size, aspects are not limited thereto. For example, the positively coupled transformer 212 (e.g., the primary coil L1 and the secondary coil L2) may have a larger size than the negatively coupled transformer 222 (e.g., the primary coil L3 and the secondary coil L4) to provide a better phase accuracy.

Various Exemplary Improvements for Switched Transformer-Based Phase Shifters

Figures 3A, 3B:
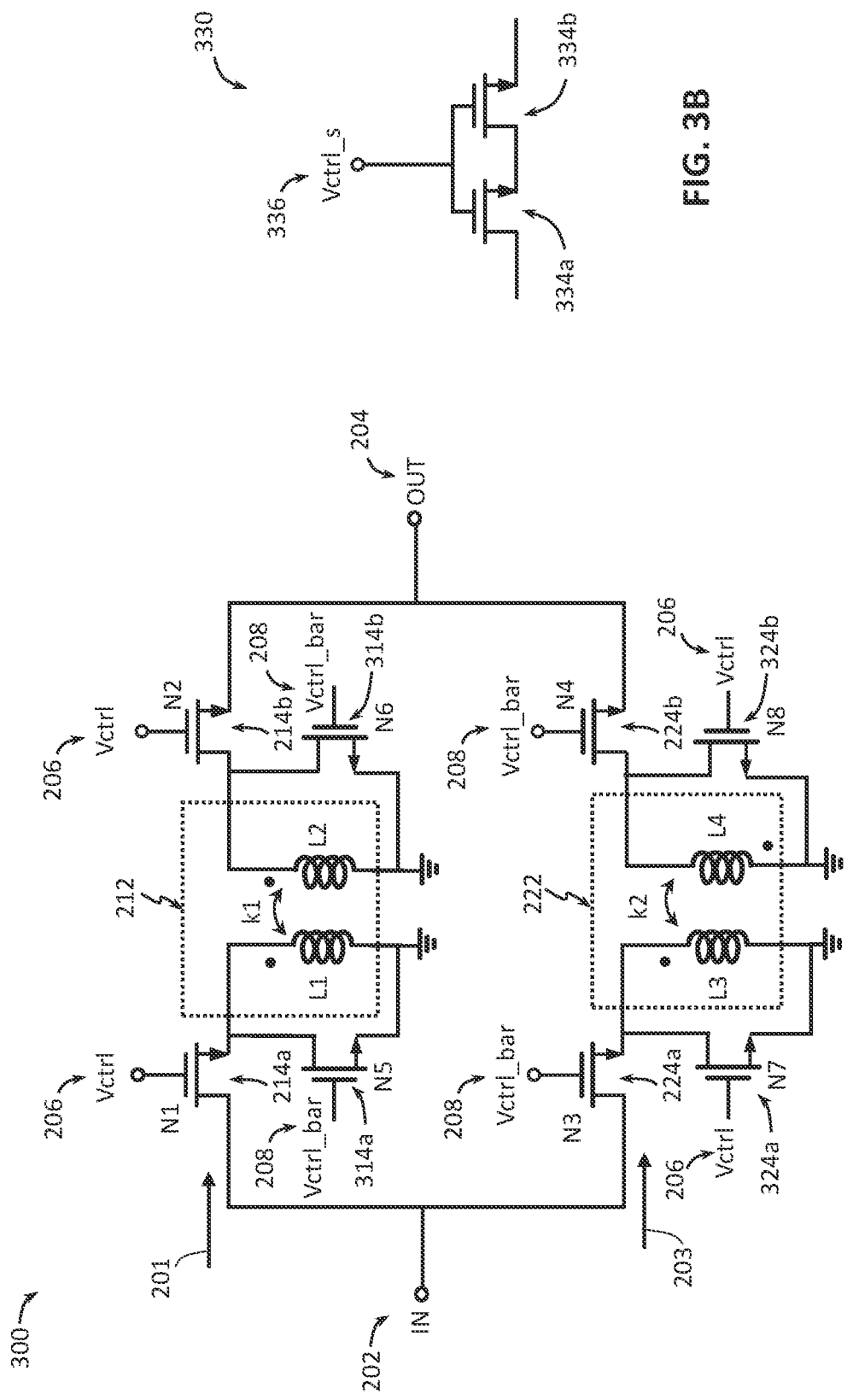
FIG. 3A is a schematic diagram illustrating an exemplary switched transformer-based phase shifter circuitry, according to some embodiments of the present disclosure.
FIG. 3B is a schematic diagram illustrating an exemplary switch circuitry, according to some embodiments of the present disclosure.

FIG. 3A is a schematic diagram illustrating an exemplary switched transformer-based phase shifter circuitry 300, according to some embodiments of the present disclosure. The phase shifter circuitry 300 may be part of an integrated circuit device. In some instances, the phase shifter circuitry 300 may be part of a multi-bit phase shifter (e.g., the multi-bit phase shifter circuitry 900 of FIG. 9). In some instances, the phase shifter circuitry 300 may be part of an RF device (e.g., the phased array system 1000 of FIG. 10). The phase shifter circuitry 300 may utilize a switched transformer topology to provide two output phase states with a phase difference of about 180 degrees. The phase shifter circuitry 300 of FIG. 3A shares many elements with the phase shifter circuitry 200 of FIG. 2; for brevity, a discussion of these elements is not repeated, and these elements may take the form of any of the embodiments disclosed herein. The phase shifter circuitry 300 may operate substantially the same as the phase shifter circuitry 200 but may provide better isolation between the two signal paths 201 and 203.

As shown in FIG. 3A, the phase shifter circuitry 300 may further include shunt FETs 314a, 314b, 324a, and 324b shown as N5, N6, N7, and N8, respectively. The shunt FET 314a is arranged on a shunt path coupled to the first signal path 201, for example, at a node between the FET 214a and the positively coupled transformer 212. The shunt FET 314b is arranged on a shunt path coupled to the first signal path 201, for example, at a node between the positively coupled transformer 212 and the FET 214b. In a similar way, the shunt FET 324a is arranged on a shunt path coupled to the second signal path 203, for example, at a node between the FET 224a and the negatively coupled transformer 222, and the shunt FET 324b is arranged on a shunt path coupled to the second signal path 203, for example, at a node between the negatively coupled transformer 222 and the FET 224b.

The addition of the shunt FETs 314 and 324 may increase isolation between the two signal paths 201 and 203. To that end, the gate terminals of the shunt FETs 314a and 314b may be controlled by (or responsive to) a control signal (e.g., Vctrl_bar) that is inverted from the first control signal 206 (e.g., Vctrl) controlling the main switches (e.g., the FETs 214a and 214b) that select the first signal path 201. Similarly, the gate terminals of the shunt FETs 324a and 324b may be controlled by (or responsive to) a control signal (e.g., Vctrl) that is inverted from the second control signal 208 (e.g., Vctrol_bar) controlling the main switches (e.g., the FETs 224a and 224b) that select the second signal path 203. That is, when the FETs 214a and 214b are turned on to enable the first signal path 201, the shunt FETs 314a and 314b (coupled to the first signal path 201) are turned off, and the shunt FETs 324a and 324b (coupled to the second signal path 203) are turned on to prevent signal leakage from the input node 102 to the output node 104 via the second signal path 203. Conversely, when the FETs 224a and 224b are turned on to enable the second signal path 203, the shunt FETs 324a and 324b (coupled to the second signal path 203) are turned off, and the shunt FETs 314a and 314b (coupled to the first signal path 201) are turned on to prevent signal leakage from the input node 102 to the output node 104 via the first signal path 201.

FIG. 3B is a schematic diagram illustrating an exemplary switch circuitry 330, according to some embodiments of the present disclosure. In some aspects, the phase shifter circuitry 200 and/or the phase shifter circuitry 300 may implement switches (e.g., the switches 214, 224, 314, 324) as shown by the switch circuitry 330. As shown, the switch circuitry 330 includes stacked FETs 334a and 334b. More specifically, the FETs 334a and 334b are connected in series where the source terminal of the FET 334a may be connected to the drain terminal of the FET 334b. The gate terminals of the stacked FETs 334a and 334b may be controlled by the same control signal 336 (shown as Vctrl_s). As an example, the switch 214a in the phase shifter circuitry 300 may be replaced by the stacked FETs 334a and 334b. In general, one or more of the other switches 214b, 224a, 224b, 314a, 314b, 324a, and 324b in the phase shifter circuitry 300 may each be replaced by the stacked FETs 334a and 334b. In some instances, all switches 214b, 224a, 224b, 314a, 314b, 324a, and 324b in the phase shifter circuitry 300 may be replaced by the stacked FETs 334a and 334b. Utilizing stacked FETs in place of a single FET for switching may improve the power handling capability of the phase shifter circuitry 200 and/or 300.

While FIG. 3B illustrates two FETs connected in series, aspects are not limited thereto. For example, any one or more of the switches 214b, 224a, 224b, 314a, 314b, 324a, and 324b in the phase shifter circuitry 300 may be placed by more than two stacked FETs (e.g., 3, 4 or more FETs in series).

There are a wide variety of factors that may cause the positively coupled transformer 212 and the negatively coupled transformer 222 to have different signal characteristics, for example, in terms of insertion loss and/or phase variations. In general, because the voltage and charge distribution conditions of the positively coupled transformer 212 and the negatively coupled transformer 222 may be different, the insertion loss between the two signal paths 201 and 203 (or the two output states) at the output node 204 can be different. Further, there can be additional phase variations over frequency between the two signal paths 201 and 203 (or the two output states) at the output node 204. FIGS. 4-8 illustrate various mechanisms (e.g., adding tuning capacitors) to improve the performance of the phase shifter circuitry 200 of FIGS. 2A-2B and/or the phase shifter circuitry 300 of FIG. 3.

Figure 4:
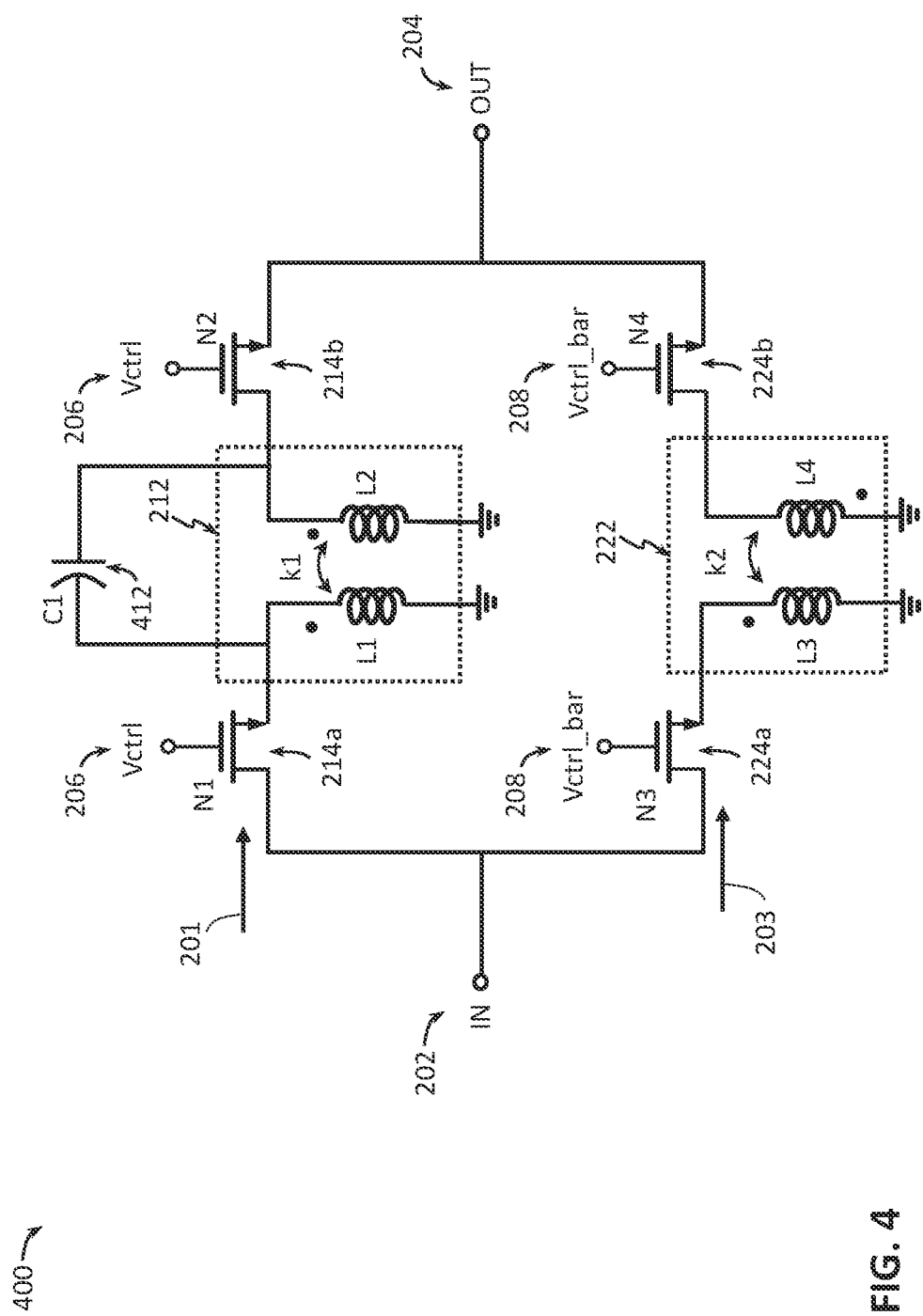
FIG. 4 is a schematic diagram illustrating an exemplary switched transformer-based phase shifter circuitry, according to some embodiments of the present disclosure.

FIG. 4 is a schematic diagram illustrating an exemplary switched transformer-based phase shifter circuitry 400, according to some embodiments of the present disclosure. The phase shifter circuitry 400 may be part of an integrated circuit device. In some instances, the phase shifter circuitry 400 may be part of a multi-bit phase shifter (e.g., the multi-bit phase shifter circuitry 900 of FIG. 9). In some instances, the phase shifter circuitry 400 may be part of an RF device (e.g., the phased array system 1000 of FIG. 10). The phase shifter circuitry 400 of FIG. 4 shares many elements with the phase shifter circuitry 200 of FIG. 2; for brevity, a discussion of these elements is not repeated, and these elements may take the form of any of the embodiments disclosed herein. The phase shifter circuitry 400 may operate in substantially the same way as the phase shifter circuitry 200 but may provide an improved phase accuracy.

Ideally, if the coupling (e.g., the factor k1) between the primary coil L1 and the secondary coil L2 of the positively coupled transformer 212 and the coupling (e.g., the factor k2) between the primary coil L3 and the secondary coil L4 of the negatively coupled transformer 222 are the same, the phase shifter circuitries 200 and/or 300 may provide a 180 degree phase-shift over a very large bandwidth. However, in practice, even if the size of the coils L1, L2, L3, and L4 are the same (with the same inductance), the parasitic components of the positively coupled transformer 212 and the negatively coupled transformer 222 can be different. The parasitic component that may impact the phase accuracy the most is the parasitic capacitance differences between the positively coupled transformer 212 and the negatively coupled transformer 222. For instance, the positively coupled transformer 212 may have a smaller parasitic capacitance between the primary coil L1 and the secondary coil L2 than the parasitic capacitance between the primary coil L3 and the secondary coil L4 at the negatively coupled transformer 222. The smaller parasitic capacitance at the positively coupled transformer 212 is due to current flowing through the primary coil L1 and the secondary coil L2 are in the same direction, causing electron charges at the primary coil L1 and the secondary coil L2 to propel from each other (e.g., further away from each other). On the other hand, current flows through the primary coil L3 and the secondary coil L4 of the negatively coupled transformer 222 in opposite directions, causing electron charges at the primary coil L3 and the secondary coil L4 to be closer to each other, and thus generates a larger parasitic capacitance.

As such, the phase shifter circuitry 400 may further include a capacitor 412 (shown as C1) coupled across a terminal of the primary coil L1 and a terminal of the secondary coil L2 of the positively coupled transformer 212 to compensate the smaller parasitic capacitance at the positively coupled transformer 212.

Figure 5:
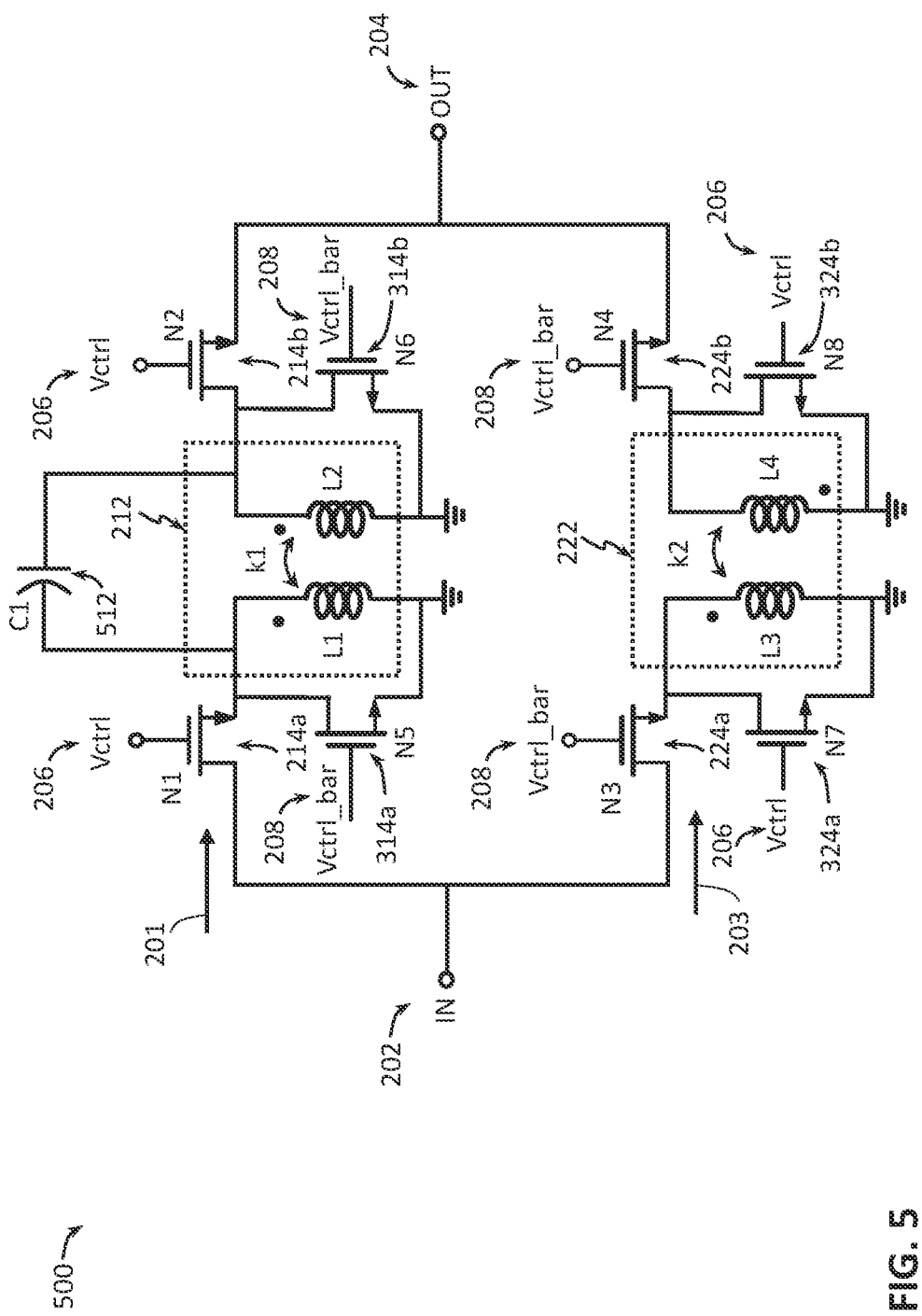
FIG. 5 is a schematic diagram illustrating an exemplary switched transformer-based phase shifter circuitry, according to some embodiments of the present disclosure.

FIG. 5 is a schematic diagram illustrating an exemplary switched transformer-based phase shifter circuitry 500, according to some embodiments of the present disclosure. The phase shifter circuitry 200 may be part of an integrated circuit device. In some instances, the phase shifter circuitry 200 may be part of a multi-bit phase shifter (e.g., the multi-bit phase shifter circuitry 900 of FIG. 9). In some instances, the phase shifter circuitry 200 may be part of an RF device (e.g., the phased array system 1000 of FIG. 10). The phase shifter circuitry 500 of FIG. 5 shares many elements with the phase shifter circuitry 300 of FIG. 3A; for brevity, a discussion of these elements is not repeated, and these elements may take the form of any of the embodiments disclosed herein. The phase shifter circuitry 500 may operate in substantially the same way as the phase shifter circuitry 300 but may provide an improved phase accuracy.

Similar to the phase shifter circuitry 400, in the phase shifter circuitry 500, the positively coupled transformer 212 may have a smaller parasitic capacitance than the negatively coupled transformer 222. Accordingly, the phase shifter circuitry 500 may further include a capacitor 512 (shown as C1) coupled across a terminal of the primary coil L1 and a terminal of the secondary coil L2 of the positively coupled transformer 212 to compensate the smaller parasitic capacitance at the positively coupled transformer 212.

While FIGS. 4 and 5 illustrate that an additional capacitor C1 can be added across the primary coil L1 and the secondary coil L2 of the positively coupled transformer 212, in some aspects, a capacitor may also be added across the primary coil L3 and the secondary coil L4 of the negatively coupled transformer 222. In general, a capacitor can be added across the primary coil L1 and the secondary coil L2 of the positively coupled transformer 212 and/or a capacitor may also be added across the primary coil L3 and the secondary coil L4 of the negatively coupled transformer 222 with the goal to have about the same capacitance at the positively coupled transformer 212 and at the negatively coupled transformer 222.

Figure 6:
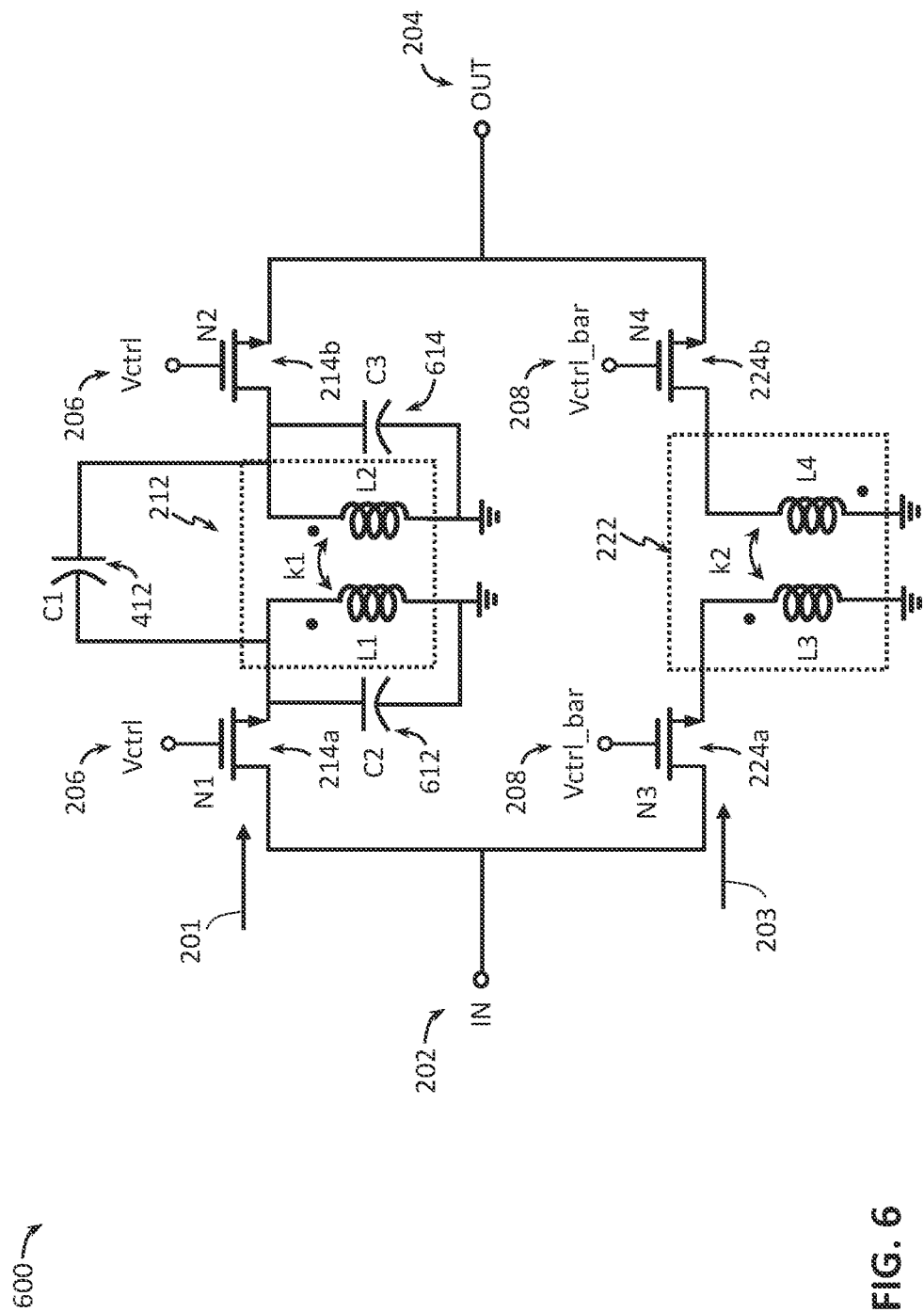
FIG. 6 is a schematic diagram illustrating an exemplary switched transformer-based phase shifter circuitry, according to some embodiments of the present disclosure.

FIG. 6 is a schematic diagram illustrating an exemplary switched transformer-based phase shifter circuitry 600, according to some embodiments of the present disclosure. The phase shifter circuitry 200 may be part of an integrated circuit device. In some instances, the phase shifter circuitry 200 may be part of a multi-bit phase shifter (e.g., the multi-bit phase shifter circuitry 900 of FIG. 9). In some instances, the phase shifter circuitry 200 may be part of an RF device (e.g., the phased array system 1000 of FIG. 10). The phase shifter circuitry 600 of FIG. 6 shares many elements with the phase shifter circuitry 400 of FIG. 4; for brevity, a discussion of these elements is not repeated, and these elements may take the form of any of the embodiments disclosed herein. The phase shifter circuitry 600 may operate in substantially the same way as the phase shifter circuitry 400 but may provide further phase accuracy improvement.

For instance, to further balance the capacitance between the positively coupled transformer 212 and the negatively coupled transformer 222, the phase shifter circuitry 600 may further include a capacitor 612 (shown as C2) connected in parallel with the primary coil L1 and a capacitor 614 (shown as C3) connected in parallel with the secondary coil L2.

Figure 7:
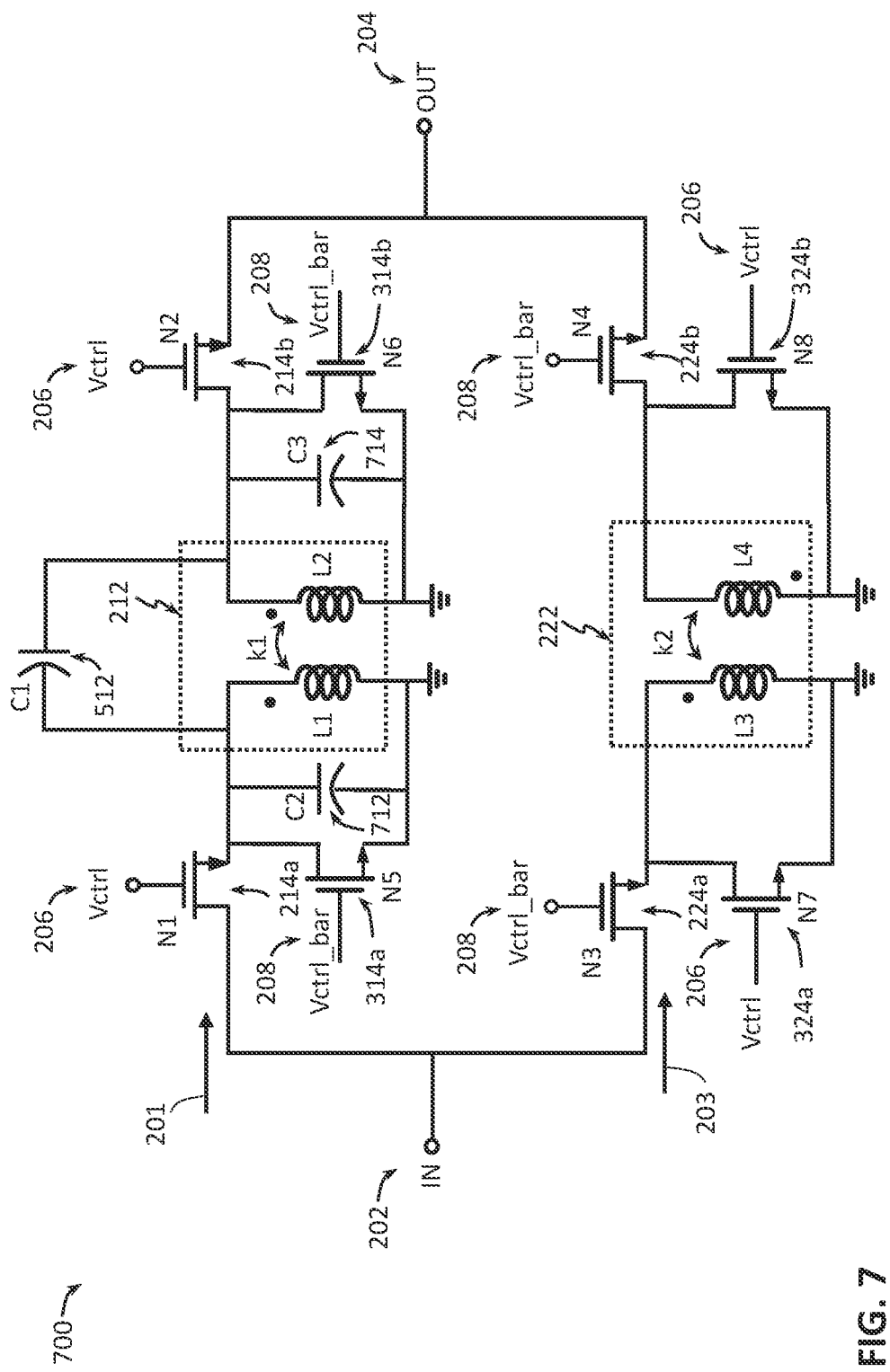
FIG. 7 is a schematic diagram illustrating an exemplary switched transformer-based phase shifter circuitry, according to some embodiments of the present disclosure.

FIG. 7 is a schematic diagram illustrating an exemplary switched transformer-based phase shifter circuitry 700, according to some embodiments of the present disclosure. The phase shifter circuitry 200 may be part of an integrated circuit device. In some instances, the phase shifter circuitry 200 may be part of a multi-bit phase shifter (e.g., the multi-bit phase shifter circuitry 900 of FIG. 9). In some instances, the phase shifter circuitry 200 may be part of an RF device (e.g., the phased array system 1000 of FIG. 10). The phase shifter circuitry 700 of FIG. 7 shares many elements with the phase shifter circuitry 500 of FIG. 6; for brevity, a discussion of these elements is not repeated, and these elements may take the form of any of the embodiments disclosed herein. The phase shifter circuitry 700 may operate in substantially the same as the phase shifter circuitry 500 but may provide further phase accuracy improvement.

As shown, similar to the phase shifter circuitry 600, the phase shifter circuitry 700 may further include a capacitor 712 (shown as C2) connected in parallel with the primary coil L1 and a capacitor 714 (shown as C3) connected in parallel with the secondary coil L2.

Figure 8:
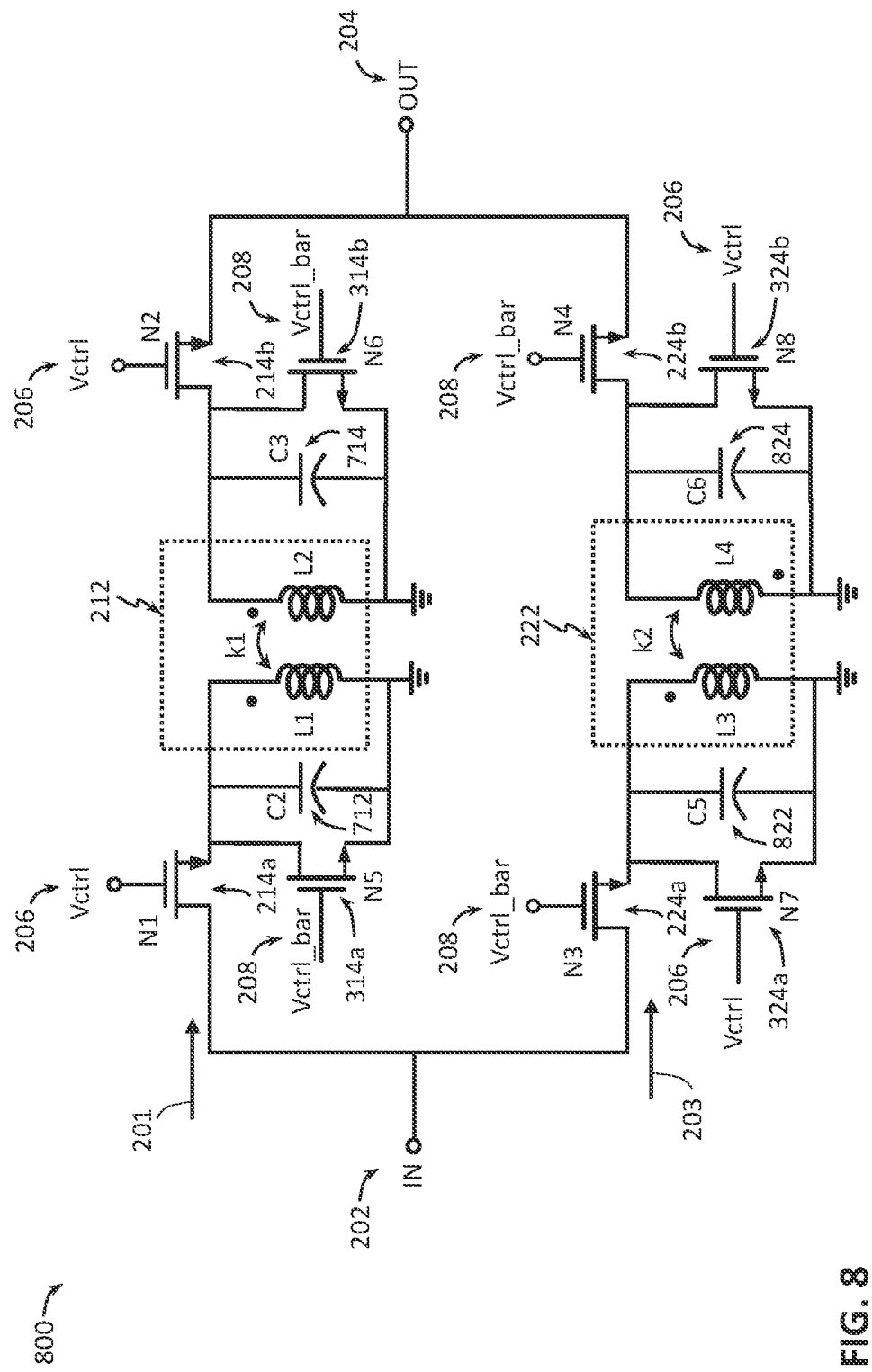
FIG. 8 is a schematic diagram illustrating an exemplary switched transformer-based phase shifter circuitry, according to some embodiments of the present disclosure.

FIG. 8 is a schematic diagram illustrating an exemplary switched transformer-based phase shifter circuitry 800, according to some embodiments of the present disclosure. The phase shifter circuitry 200 may be part of an integrated circuit device. In some instances, the phase shifter circuitry 200 may be part of a multi-bit phase shifter (e.g., the multi-bit phase shifter circuitry 900 of FIG. 9). In some instances, the phase shifter circuitry 200 may be part of an RF device (e.g., the phased array system 1000 of FIG. 10). The phase shifter circuitry 800 of FIG. 8 shares many elements with the phase shifter circuitry 700 of FIG. 7; for brevity, a discussion of these elements is not repeated, and these elements may take the form of any of the embodiments disclosed herein. The phase shifter circuitry 800 may operate in substantially the same way as the phase shifter circuitry 700.

As shown, the phase shifter circuitry 800 may further include a capacitor 822 (shown as C5) connected in parallel with the primary coil L3 of the negatively coupled transformer 222 and a capacitor 824, a capacitor 824 (shown as C6) connected in parallel with the secondary coil L4 of the negatively coupled transformer 222. However, the phase shifter circuitry 800 may not include the capacitor 712 C1 across the primary coil L1 and the second coil L2 of the positively coupled transformer 212 as in the phase shifter circuitry 700.

In general, a phase shifter circuitry (e.g., the phase shifter circuitries 200, 300, 400, 500, 600, 700, and/or 800) may include one or more capacitor(s) arranged in various configurations to balance the parasitic capacitance difference between the positively coupled transformer 212 and the negatively coupled transformer 222 so that the phase shifter circuitry may provide a better phase-shift accuracy. For instance, a first capacitor can be arranged across the primary coil L1 and the secondary coil L2 of the positively coupled transformer 212, a second capacitor can be arranged in parallel with the primary coil L1 of the positively coupled transformer 212, a third capacitor can be arranged in parallel with the secondary coil L2 of the positively coupled transformer 212, a fourth capacitor can be arranged across the primary coil L3 and the secondary coil L4 of the negatively coupled transformer 222, a fifth capacitor can be arranged in parallel with the primary coil L3 of the negatively coupled transformer 222, and/or a sixth capacitor can be arranged in parallel with the secondary coil L4 of the negatively coupled transformer 222.

While the switches 214, 224, 314, and/or 324 in the phase shifter circuitries 200, 300, 400, 500, 600, 700, and 800 are shown as negative-positive-negative (NPN) transistors, the switches 214, 224, 314, and/or 324 can be implemented using any suitable transistors, such as positive-negative-positive (PNP) transistors, metal-oxide-semiconductor (MOS) devices, and/or complementary-metal-oxide-semiconductor (CMOS) devices.

Example Multi-Bit Phase Shifter

Figure 9:
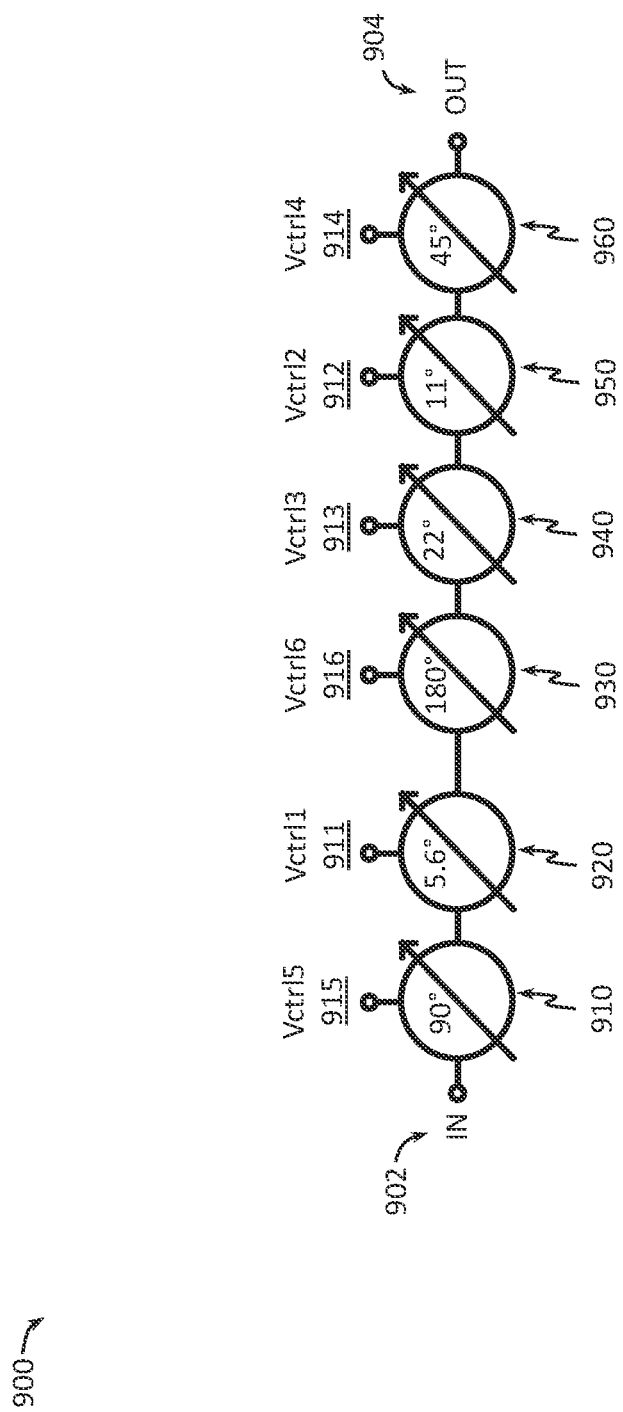
FIG. 9 is a schematic diagram illustrating an exemplary multi-bit phase shifter, according to some embodiments of the present disclosure.

FIG. 9 is a schematic diagram illustrating an exemplary multi-bit phase shifter circuitry 900, according to some embodiments of the present disclosure. The multi-bit phase shifter circuitry 900 may be part of an integrated circuit device. In some instances, the multi-bit phase shifter circuitry 900 may be part of an RF device (e.g., the phased array system 1000 of FIG. 10).

As shown, the multi-bit phase shifter circuitry 900 may include an input node 902, an output node 904, and a plurality of adjustable or switchable phase shifter circuitries 910, 920, 930, 940, 950, and 960 connected in series between the input node 902 and the output node 904. Each of the phase shifter circuitries 910, 920, 930, 940, 950, and 960 may provide a different phase-shifts responsive to a respective control signal or control bit. For instance, the phase shifter circuitry 910 may be configured to provide a phase-shift of 0° or 90° based on a control signal 915 (shown as Vctrl5) being a logic high or a logic low, respectively, or vice versa. The phase shifter circuitry 920 may be configured to provide a phase-shift of 0° or 5.6° based on a control signal 911 (shown as Vctrl1) being a logic high or a logic low, respectively, or vice versa. The phase shifter circuitry 930 may be configured to provide a phase-shift of 0° or 180° based on a control signal 916 (shown as Vctrl6) being a logic high or a logic low, respectively, or vice versa. The phase shifter circuitry 940 may be configured to provide a phase-shift of 0° or 22° based on a control signal 913 (shown as Vctrl3) being a logic high or a logic low, respectively, or vice versa. The phase shifter circuitry 950 may be configured to provide a phase-shift of 0° or 11° based on a control signal 912 (shown as Vctrl2) being a logic high or a logic low, respectively, or vice versa. The phase shifter circuitry 960 may be configured to provide a phase-shift of 0° or 45° based on a control signal 914 (shown as Vctrl4) being a logic high or a logic low, respectively, or vice versa. In some aspects, the 180° phase shifter circuitry 930 may be implemented using any one of the switched transformer topologies discussed above with reference to FIGS. 2A-2B, 3A-3B, and 4-8.

In some aspects, each of the control signals 911, 912, 913, 914, 915, and 916 may be generated according to a separate control bit of a control word (e.g., with bits b0, b1, b2, b3, b4, and b5) for configuring the multi-bit phase shifter circuitry 900. As an example, the control signals 911, 912, 913, 914, 915, and 916 may each be controlled by b0, b1, b2, b3, b4, and b5, respectively. A control signal 911, 912, 913, 914, 915, and or 916 may be set to a logic high when a corresponding bit is 1 and may set to a logic low when the corresponding bit is 0, or vice versa. In some aspects, the phase shifter circuitries 910, 920, 930, 940, 950, and 960 may be arranged in an order based on the insertion loss and/or a return loss of the individual circuit blocks. However, in general, the phase shifter circuitries 910, 920, 930, 940, 950, and 960 may be arranged in any suitable order and corresponding control signals 915, 911, 916, 913, 912, and 914 may be mapped to any suitable bits of the control word.

In operation, the phase shifter circuitry 900 may receive an input signal at the input node 902. The input signal may be phase-shifted by one or more of the phase shifter circuitries 910, 920, 930, 940, 950, and 960 depending on whether each of the control signals 915, 911, 916, 913, 912, and 914 is a logic high or a logic low, respectively. The phase shifter circuitry 900 may output an output signal at the output node 904, where the output signal may correspond to a phase-shifted version of the input signal.

While FIG. 9 illustrates the multi-bit phase shifter circuitry 900 as a 6-bit phase shifter including six phase shifter circuitries 910, 920, 930, 940, 950, and 960 controlled by a 6-bit control word, aspects are not limited thereto. In general, the switched transform-based phase shifting topology may be used to implement a multi-bit phase shifter including a smaller number of phase shifter circuitries (e.g., 1, 2, 3, 4, 5) or a greater number of phase shifter circuitries (e.g., 7, 8 or more).

Example Phased Array System

Figure 10:
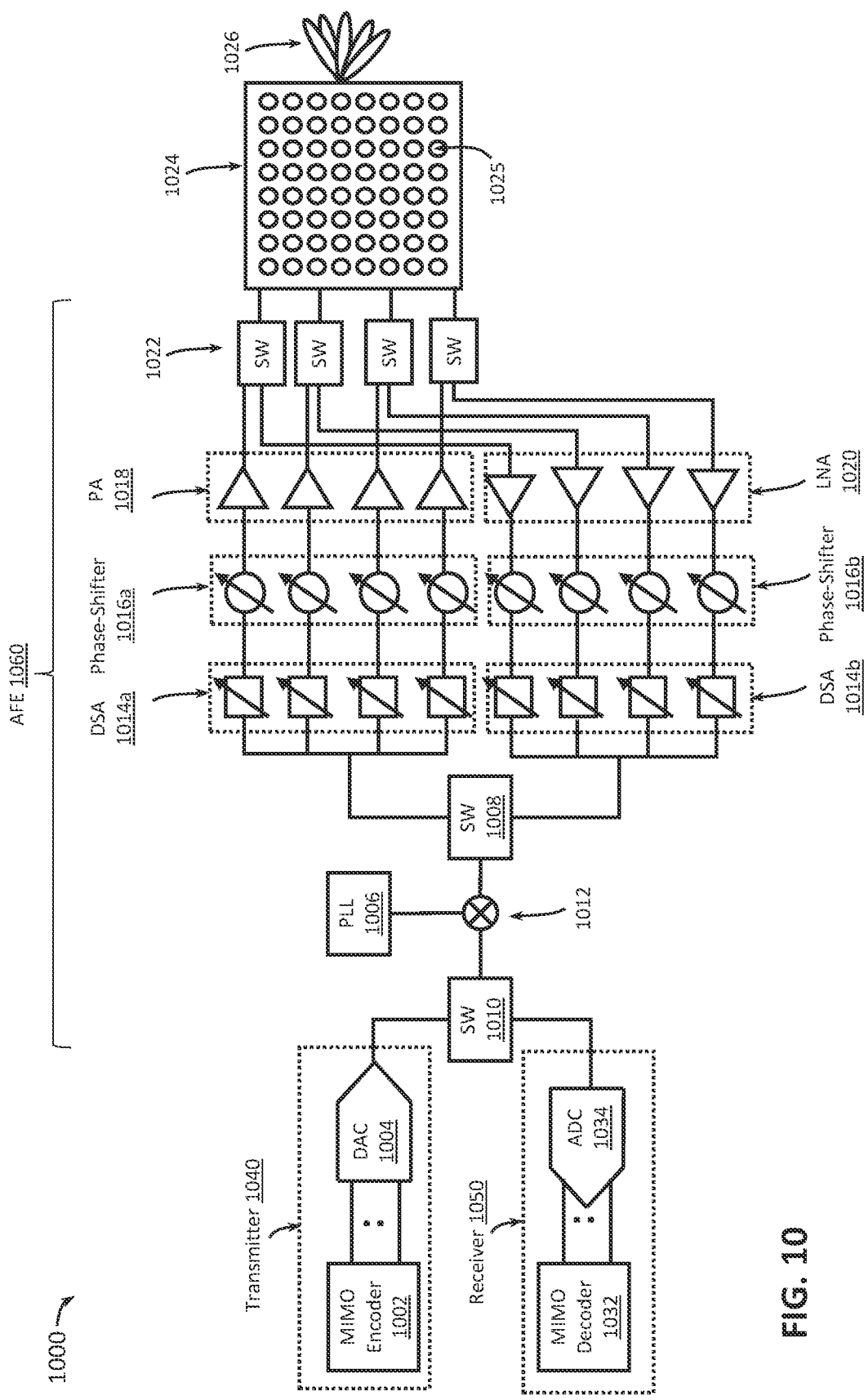
FIG. 10 is a block diagram illustrating an exemplary phased array system, according to some embodiments of the present disclosure.

FIG. 10 is a block diagram illustrating an exemplary phased array system 1000, according to some embodiments of the present disclosure. The phased array system 1000 may be part of an RF system. In some instances, the phase shifter circuitry may correspond to a portion of a wireless communication device. In other instances, the phased array system

1000 may correspond to a portion of a base station. The phased array system 1000 may operate in any suitable frequency range. In some aspects, the phased array system 1000 may operate over a Ku band and/or a Ka band.

As shown, the system 1000 may include a transmitter 1040, a receiver 1050, an analog frontend (AFE) 1060, and an antenna array 1024. The transmitter 1040 may include a multiple-input and multiple-output (MIMO) encoder 1002 and a digital-to-analog converter (DAC) 1004. The receiver 1050 may include a MIMO decoder 1032 and an analog-to-digital converter (ADC) 1034. The AFE 1060 may include a switch 1010 (shown as SW), a multiplier 1012, a phase-locked loop (PLL) 1006, another switch 1008 (shown as SW), a plurality of digital step attenuators (DSAs) 1014 (shown as 1014a and 1014b), a plurality of phase shifters 1016 (shown as 1016a and 1016b), a plurality of power amplifiers (PAs) 1018, a plurality of low-noise amplifiers (LNAs) 1020, and a plurality of switches 1022 (shown as SW). The MIMO encoder 1002 and the MIMO decoder 1032 may be implemented using a combination of hardware and/or software. The rest of the components in the system 1000 may be implemented in hardware and at least some of the component can be controlled by software.

In a transmit direction, the MIMO encoder 1002 may generate a plurality of data streams (e.g., about 2, 4, 8, 16 or more). The DAC 1004 may be coupled to the MIMO encoder and may convert the data streams into analog signals for transmission. The switch 1010 may switch between the transmitter 1040 and the receiver 1050. The multiplier 1012 may multiply (or mix) the transmit analog signals with a PLL signal generated by the PLL 1006. The switch 1008 may be selected to couple the output signal of the multiplier 1012 to the DSAs 1014a. The DSAs 1014a may be programmed to various attenuation steps to attenuate corresponding signals. The phase shifters 1016a may each be coupled to one of the DSAs 1014a and controlled to shift the phase of a corresponding signal by a certain phase-shift (e.g., 45°, 90°, 180°, etc.). In some aspects, each phase shifter 1016a may be a multi-bit phase shifter similar to the multi-phase shifter circuitry 900 discussed above with reference to FIG. 9. In some aspects, each phase shifter 1016a may provide various phase shifts including a phase shift of 180° implemented using the switched transformer-based topologies discussed above with reference to FIGS. 2A-2B, 3A-3B, and/or 4-8. The PAs 1018 may each be coupled to one of the phase shifters 1016a to amplify a corresponding phase-shifted signal for transmission. In some aspects, the DSAs 1014a, the phase shifters 1016a, and the PAs 1018 may be configured together to beamform in a certain spatial direction for transmission. The switches 1022 may be selected to couple the phase-shifted signals to the antenna array 1024 for transmission. The antenna array 1024 may include a plurality of antenna elements 1025 (e.g., arranged in a plurality of rows and a plurality of columns as shown). The antenna array 1024 may include any suitable number of antenna elements (e.g., 4, 8, 16, 64, 128, 1024 or more). Each antenna element 1025 may be configured to transmit a signal with a different phase-shift (e.g., from the phase shifters 1016a) to achieve beamforming in a certain spatial direction. For instance, the antenna array 1024 may transmit a signal carried in any one of the beams 1026.

In a receive direction, a signal may be received by the antenna array 1024 via the antenna elements 1025. The switches 1022 may be selected to couple various antenna elements 1025 to the LNAs 1020. The LNAs 1020 may amplify the received signals. The phase shifters 1016b may be substantially similar to the phase shifters 1016a and may apply various phase shifts (e.g., 45°, 90°, 180°, etc.) to the received signals. Similarly, The DSAs 1014b may be substantially similar to the DSAs 1014a and may each be coupled to one of the phase shifters 1016b to provide signal attenuations. In some aspects, the DSAs 1014b, the phase shifters 1016b, and the LNAs 1020 may be configured together to beamform in a certain spatial direction for reception, for example, to receive a signal using any one of the beams 1026. The switch 1008 may be selected to couple the received signals to the multiplier 1012 for mixing with a PLL signal generated by the PLL 1006. The SW 1010 can be selected to couple the received signals to the receiver 1050. At the receiver 1050, the ADC 1034 may convert the received signal from an analog domain to a digital domain. The MIMO decoder 1032 may be coupled to the ADC 1034 and may decode information from the received digital signals (e.g., about 2, 4, 8, 16 or more).

In some aspects, the DSAs 1014a and 1014b, the phase shifters 1016a and 1016b, the PAs 1018, and the LNAs 1020 may be integrated onto a single integrated circuit device, for example, for transmit beamforming and/or receive beamforming.

While FIG. 10 illustrates four transmit paths (e.g., each including a DSA 1014a, a phase shifter 1016a, and a PA 1018) and four receive paths (e.g., each including a DSA 1014b, a phase shifter 1016b, and an LNA 1020) in the system 1000, a phased array system can include any suitable number of paths. In some examples, a phase array system may include 2, 8, 16 or more paths for transmission and 2, 8, 16 or more paths for reception. Since each transmit path or each receive path may include a phase shifter, the switched transformer-based phase shifter circuitries disclosed herein can advantageously reduce the size of a phased array system or a beamforming integrated device.

Example Phase-Shifting Method

Figure 11:
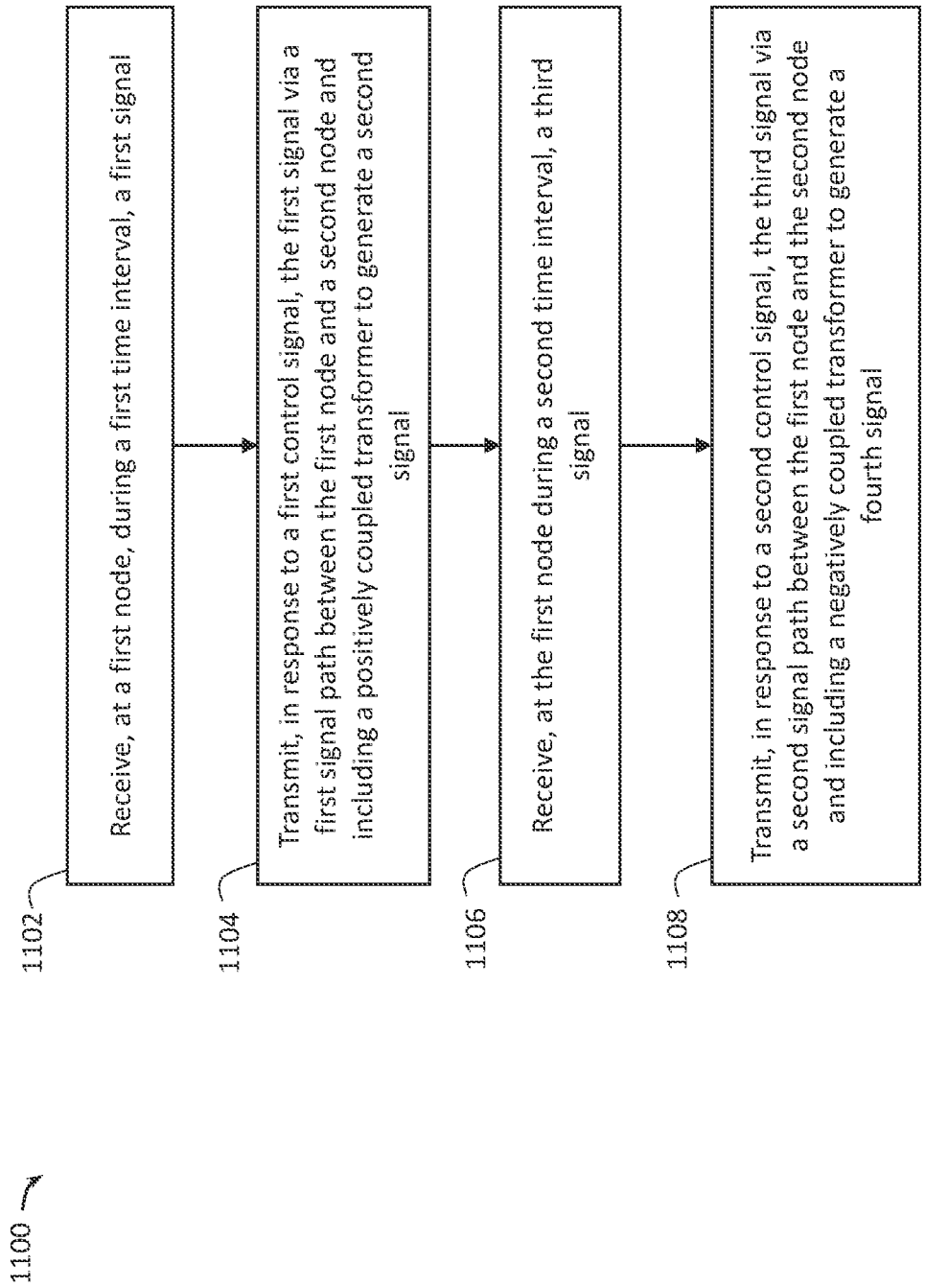
FIG. 11 is a flow diagram illustrating an exemplary method for performing phase-shifting, according to some embodiments of the present disclosure.

FIG. 11 is a flow diagram illustrating an exemplary method 1100 for performing phase-shifting, according to some embodiments of the present disclosure. The method 1100 can be implemented by phase circuitries similar to the phase shifter circuitries 200, 300, 400, 500, 600, 700, and 800 discussed above with reference to FIGS. 2A-2B, 3A, 4, 5, 6, 7, and 8, respectively, multi-phase shifter circuitry similar to the multi-bit phase shifter circuitry 900 discussed above with reference to FIG. 9, and/or a phase array system similar the phased array system 1000 discussed above with reference to FIG. 10, and/or any suitable wireless device. Although the operations of the method 1100 may be illustrated with reference to particular embodiments of the phase shifter circuitries disclosed herein, the method 1100 may be performed using any suitable hardware components and/or software components. Operations are illustrated once each and in a particular order in FIG. 11, but the operations may be performed in parallel, reordered, and/or repeated as desired.

At 1102, a first signal is received at a first node during a first time interval.

At 1104, the first signal is transmitted, in response to a first control signal, via a first signal path between the first node and a second node and including a positively coupled transformer to generate a second signal. In some aspects, the first signal path may correspond to the first signal path 201 and the positively coupled transformer may correspond to the positively coupled transformer 212 discussed above with reference to FIGS. 2A, 2B, 3A, and 4-8. In some aspects, a primary coil (e.g., L1) of the positively coupled transformer has a routing structure in a first direction, and a secondary coil (e.g., L3) of the positively coupled transformer has a routing structure in the same first direction, for example, as shown in FIG. 2B.

At 1106, a third signal is received at the first node during a second time interval. The second time interval may be a different time interval than the first time interval. In some aspects, the first time interval and the second time interval may correspond to different radio frames, different subframes, or different time slots (e.g., in the context of LTE or 5G). For instance, the first signal may carry first data information (e.g., first encoded data bits) in the first time interval, and the second signal may carry second data information (e.g., second encoded data bits) in the second time interval. In some instances, the first data information can be different from the second data information. In some other instances, the first data information can be the same as the second data information, where the second signal is a retransmission of the first data information.

At 1108, the second signal is transmitted, in response to a second control signal, the third signal via a second signal path between the first node and the second node including a negatively coupled transformer to generate a fourth signal with the third signal. In some aspects, the second signal path may correspond to the second signal path 203 and the negatively coupled transformer may correspond to the negatively coupled transformer 222 discussed above with reference to FIGS. 2A, 2B, 3A, and 4-8. In some aspects, a primary coil (e.g., L3) of the negatively coupled transformer has a routing structure in a second direction, and a secondary coil (e.g., L4) of the negatively coupled transformer has a routing structure in a third direction opposite of the first direction.

In some aspects, the method 1100 may further include closing a first switch coupled between the first node and the positively coupled transformer and opening a second switch coupled between the first node and the negatively coupled transformer to select, in response to the first control signal, the first signal path for transmitting the first signal at 1104. In some aspects, the first switch may correspond to the switch 214a or the switch 214b, and the second switch may correspond to the switch 224a or the switch 224b. In some aspects the first and second switches may be FETs. In some aspects, the method 1100 may further include opening a third switch (e.g., the shunt FET 314a or 314b) coupled between the first signal path and a ground potential and closing a fourth switch (e.g., the shunt FET 324a or 324b) coupled between the second signal path and a ground potential.

In some aspects, the method 1100 may further include opening a first switch coupled between the first node and the positively coupled transformer and closing a second switch coupled between the first node and the negatively coupled transformer to select the second signal path for transmitting the second signal in response to the second control signal at 1108. In some aspects, the first switch may correspond to the switch 214a or the switch 214b, and the second switch may correspond to the switch 224a or the switch 224b. In some aspects the first and second switches may be FETs. In some aspects, the method 1100 may further include closing a third switch (e.g., the shunt FET 314a or 314b) coupled between the first signal path and a ground potential and opening a fourth switch (e.g., the shunt FET 324a or 324b) coupled between the second signal path and a ground potential.

In some aspects, the first control signal and the second control signal are inverted signals. For instance, the first control signal may correspond to the control signal 206 (e.g., Vctrl), and the second control signal may correspond to the control signal 208 (e.g., Vctrl_bar).

EXAMPLES

Example 1 includes a phase shifter circuitry including a first node; a second node; a first signal path coupled between the first node and the second node, the first signal path including a positively coupled transformer; a second signal path between the first node and the second node, the second signal path including a negatively coupled transformer; and a plurality of switches to select the first signal path or the second signal path.

Example 2 includes the phase shifter circuitry of Example 1, where a voltage across a primary coil of the positively coupled transformer and a voltage across a secondary coil of the positively coupled transformer are in-phase; and a voltage across the primary coil of the negatively coupled transformer and a voltage across the secondary coil of the negatively coupled transformer are out-of-phase.

Example 3 includes the phase shifter circuitry of any of Examples 1-2, where a first switch of the plurality of switches is coupled between the first node and the positively coupled transformer and responsive to a first control signal; and a second switch of the plurality of switches is coupled between the first node and the negatively coupled transformer and responsive to a second control signal.

Example 4 includes the phase shifter circuitry of any of Examples 1-3, where a third switch of the plurality of switches is coupled between the positively coupled transformer and the second node and responsive to the first control signal; and a fourth switch of the plurality of switches is coupled between the negatively coupled transformer and the second node and responsive to the second control signal.

Example 5 includes the phase shifter circuitry of any of Examples 1-4, where the first control signal associated with the first signal path and the second control signal associated with the second signal path have opposite phases.

Example 6 includes the phase shifter circuitry of any of Examples 1-5, further including a shunt path coupled to the first signal path, where a third switch of the plurality of switches is arranged on the shunt path and responsive to the second control signal.

Example 7 includes the phase shifter circuitry of any of Examples 1-5, further including a shunt path coupled to the second signal path, where a third switch of the plurality of switches is arranged on the shunt path and responsive to the first control signal.

Example 8 includes the phase shifter circuitry of any of Examples 1-7, where at least one of the first switch or the second switch includes a field effect transistor (FET).

Example 9 includes the phase shifter circuitry of any of Examples 1-7, where at least one of the first switch or the second switch includes stacked field effect transistors (FETs).

Example 10 includes the phase shifter circuitry of any of Examples 1-9, where the positively coupled transformer and the negatively coupled transformer have different sizes.

Example 11 includes the phase shifter circuitry of any of Examples 1-10, where the positively coupled transformer has a larger size than the negatively coupled transformer.

Example 12 includes the phase shifter circuitry of any of Examples 1-11, further including a capacitor coupled across a primary coil and a secondary coil of the positively coupled transformer.

Example 13 includes the phase shifter circuitry of any of Examples 1-12, further including a capacitor coupled between a primary coil and a secondary coil of the negatively coupled transformer.

Example 14 includes the phase shifter circuitry of any of Examples 1-13, further including a capacitor connected in parallel with a primary coil or a secondary coil of the positively coupled transformer.

Example 15 includes the phase shifter circuitry of any of Examples 1-14, further including a capacitor connected in parallel with a primary coil or a secondary coil of the negatively coupled transformer.

Example 16 includes the phase shifter circuitry of any of Examples 1-15, where the phase shifter circuitry is a 180 degree phase shifter circuitry.

Example 17 includes the phase shifter circuitry of any of Examples 1-16, where the phase shifter circuitry is a multi-bit phase shifter circuitry.

Example 18 includes an apparatus including a first phase shifter including a first node to receive an input signal; a second node; a first signal path coupled between the first node and the second node, the first signal path including a positively coupled transformer; a second signal path coupled between the first node and the second node, the second signal path including a negatively coupled transformer, where the second signal path is out-of-phase with the first signal path at the second node; and a plurality of switches to select the first signal path or the second signal path.

Example 19 includes the apparatus of Example 18, where the first phase shifter further includes at least one of a first capacitor coupled across a primary coil of the positively coupled transformer; a second capacitor coupled across a secondary coil of the positively coupled transformer; a third capacitor coupled across a primary coil of the negatively coupled transformer; or a fourth capacitor coupled across a secondary coil of the negatively coupled transformer.

Example 20 includes the apparatus of any of Examples 18-19, further including a second phase shifter connected in series with the first phase shifter.

Example 21 includes the apparatus of any of Examples 18-20, where the first phase shifter is responsive to a first control bit; and the second phase shifter is responsive to a second control bit separate from the first control bit.

Example 22 includes the apparatus of any of Examples 18-21, where the apparatus is a phased array system; and the apparatus further includes an antenna array; and a plurality of phase shifters coupled to the antenna array, the plurality of phase shifters including the first phase shifter.

Example 23 includes a method for performing phase-shifting, the method including receiving, at a first node during a first time interval, a first signal; transmitting, in response to a first control signal, the first signal via a first signal path between the first node and a second node and including a positively coupled transformer to generate a second signal; receiving, at the first node during a second time interval, a third signal; and transmitting, in response to a second control signal, the third signal via a second signal path between the first node and the second node and including a negatively coupled transformer to generate a fourth signal.

Example 24 includes the method of Example 23, where a primary coil of the positively coupled transformer has a routing structure in a first direction; a secondary coil of the positively coupled transformer has a routing structure in the first direction; a primary coil of the negatively coupled transformer has a routing structure in a second direction; and a secondary coil of the negatively coupled transformer has a routing structure in a third direction opposite of the first direction.

Example 25 includes the method of any of Examples 23-24, further including closing a first switch coupled between the first node and the positively coupled transformer and opening a second switch coupled between the first node and the negatively coupled transformer to select the first signal path for transmitting the first signal in response to the first control signal.

Example 26 includes the method of any of Examples 23-25, further including opening the first switch coupled between the first node and the positively coupled transformer and closing the second switch coupled between the first node and the negatively coupled transformer to select the second signal path for transmitting the third signal in response to the second control signal.

Example 27 includes the method of any of Examples 23-26, where the first control signal and the second control signal are inverted signals.

Example 28 includes an apparatus including means for performing the method according to any one of examples 23-27.

Variations and Implementations

While embodiments of the present disclosure were described above with references to exemplary implementations as shown in FIGS. 1, 2A-2B, 3A-3B, 4-10, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as switches, FETs, positively coupled transformer, negatively coupled transformer 222, ADCs, DACs, DSAs, phase shifters, PAs, LNAs, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to 180 degree phase shifters, in various communication systems.

Parts of various systems for implementing 180 degree phase shifters as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the phase shifter circuitries shown in FIGS. 2A-2B, 3A, 4-9, and/or the phased array system shown in FIG. 10) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:
1. A phase shifter circuitry comprising:
a first node;
a second node;
a first signal path coupled between the first node and the second node, the first signal path comprising a positively coupled transformer;
a second signal path between the first node and the second node arranged in parallel with the first signal path, the second signal path comprising a negatively coupled transformer; and a plurality of switches to select the first signal path or the second signal path, the plurality of switches comprising a first switch in the first signal path in series with the positively coupled transformer and a separate second switch in the second signal path in series with the negatively coupled transformer.

2. The phase shifter circuitry of claim 1, wherein:
a voltage across a primary coil of the positively coupled transformer and a voltage across a secondary coil of the positively coupled transformer are in-phase; and
a voltage across a primary coil of the negatively coupled transformer and a voltage across a secondary coil of the negatively coupled transformer are out-of-phase.

3. The phase shifter circuitry of claim 1, wherein:
the first switch of the plurality of switches is coupled between the first node and the positively coupled transformer and responsive to a first control signal; and
the second switch of the plurality of switches is coupled between the first node and the negatively coupled transformer and responsive to a second control signal.

4. The phase shifter circuitry of claim 3, wherein the first control signal associated with the first signal path and the second control signal associated with the second signal path are logical complements of each other so that when the first control signal is asserted to close the first switch, the second control signal is de-asserted to open the second switch or vice versa.

5. The phase shifter circuitry of claim 3, further comprising:
a shunt path coupled to the first signal path,
wherein a third switch of the plurality of switches is arranged on the shunt path and responsive to the second control signal;
and wherein the shunt path is arranged to establish a shunt across a secondary coil of the positively coupled transformer when the third switch is closed.

6. The phase shifter circuitry of claim 3, wherein at least one of the first switch or the second switch comprises one or more field effect transistors (FETs).

7. The phase shifter circuitry of claim 1, wherein the positively coupled transformer and the negatively coupled transformer have different sizes.

8. The phase shifter circuitry of claim 1, further comprising:
a capacitor coupled across a primary coil and a secondary coil of the positively coupled transformer.

9. The phase shifter circuitry of claim 1, further comprising at least one of:
a capacitor connected in parallel with a primary coil or a secondary coil of the positively coupled transformer; or
a capacitor connected in parallel with a primary coil or a secondary coil of the negatively coupled transformer.

10. The phase shifter circuitry of claim 1, wherein the phase shifter circuitry is a 180 degree phase shifter circuitry.

11. The phase shifter circuitry of claim 1, wherein the phase shifter circuitry is a multi-bit phase shifter circuitry.

12. An apparatus comprising:
a first phase shifter comprising:
a first node to receive an input signal;
a second node;
a first signal path coupled between the first node and the second node, the first signal path comprising a positively coupled transformer;
a second signal path coupled between the first node and the second node arranged in parallel with the first signal path, the second signal path comprising a negatively coupled transformer, wherein the second signal path is out-of-phase with the first signal path at the second node; and
a plurality of switches to select the first signal path or the second signal path, the plurality of switches comprising a first switch in the first path in series with the positively coupled transformer and a separate second switch in the second path in series with the negatively coupled transformer.

13. The apparatus of claim 12, wherein the first phase shifter further comprises at least one of:
a first capacitor coupled across a primary coil of the positively coupled transformer;
a second capacitor coupled across a secondary coil of the positively coupled transformer;
a third capacitor coupled across a primary coil of the negatively coupled transformer; or
a fourth capacitor coupled across a secondary coil of the negatively coupled transformer.

14. The apparatus of claim 12, further comprising:
a second phase shifter connected in series with the first phase shifter.

15. The apparatus of claim 14, wherein:
the first phase shifter is responsive to a first control bit; and
the second phase shifter is responsive to a second control bit separate from the first control bit.

16. The apparatus of claim 12, wherein:
the apparatus is a phased array system; and
the apparatus further comprises:
an antenna array; and
a plurality of phase shifters coupled to the antenna array, the plurality of phase shifters comprising the first phase shifter.

17. A method for performing phase-shifting, the method comprising:
receiving, at a first node during a first time interval, a first signal;
transmitting, in response to a first control signal, the first signal via a first signal path between the first node and a second node, the first signal path comprising a first switch in series with a positively coupled transformer to generate a second signal;
receiving, at the first node during a second time interval, a third signal; and
transmitting, in response to a second control signal, the third signal via a second signal path between the first node and the second node, the second signal path arranged in parallel with the first signal path and comprising a negatively coupled transformer to generate a fourth signal.

18. The method of claim 17, wherein:
a primary coil of the positively coupled transformer comprises a planar routing structure oriented in a first direction;
a secondary coil of the positively coupled transformer comprises a planar routing structure oriented in the first direction;
a primary coil of the negatively coupled transformer comprises a planar routing structure oriented in a second direction; and
a secondary coil of the negatively coupled transformer has a routing structure in a third direction opposite of the first direction.

19. The method of claim 17, further comprising:
closing the first switch coupled between the first node and the positively coupled transformer and opening a separate second switch in the second signal path coupled between the first node and the negatively coupled transformer to select the first signal path for transmitting the first signal in response to the first control signal.

20. The method of claim 17, wherein the first control signal and the second control signal are logical complements of each other.

* * * * *